(12) United States Patent
Surthi

(10) Patent No.: US 12,057,400 B2
(45) Date of Patent: Aug. 6, 2024

(54) INTEGRATED ASSEMBLIES AND METHODS OF FORMING INTEGRATED ASSEMBLIES

(71) Applicant: Micron Technology, Inc., Boise, ID (US)

(72) Inventor: Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 350 days.

(21) Appl. No.: 17/395,726

(22) Filed: Aug. 6, 2021

(65) Prior Publication Data

US 2023/0043163 A1  Feb. 9, 2023

(51) Int. Cl.
| | |
|---|---|
| *H01L 23/535* | (2006.01) |
| *H01L 21/768* | (2006.01) |
| *H01L 23/528* | (2006.01) |
| *H01L 23/532* | (2006.01) |
| *H10B 41/27* | (2023.01) |
| *H10B 43/27* | (2023.01) |

(52) U.S. Cl.
CPC ...... *H01L 23/535* (2013.01); *H01L 21/76895* (2013.01); *H01L 23/5283* (2013.01); *H01L 23/53266* (2013.01); *H10B 41/27* (2023.02); *H10B 43/27* (2023.02)

(58) Field of Classification Search
CPC ...................................................... H10B 43/27
See application file for complete search history.

(56) References Cited

U.S. PATENT DOCUMENTS

| | | | |
|---|---|---|---|
| 10,283,513 B1 | 5/2019 | Zhou et al. | |
| 10,593,695 B1* | 3/2020 | Kim | ................. H01L 29/40114 |
| 2010/0163968 A1* | 7/2010 | Kim | ...................... H10B 43/27 |
| | | | 257/E21.423 |
| 2018/0374860 A1 | 12/2018 | Goda et al. | |
| 2019/0189630 A1 | 6/2019 | Greenlee et al. | |
| 2020/0083251 A1 | 3/2020 | Lee | |
| 2021/0098486 A1 | 4/2021 | Hopkins et al. | |

FOREIGN PATENT DOCUMENTS

| | | |
|---|---|---|
| CN | 111183520 | 5/2020 |
| WO | WO PCT/US2022/037731 | 11/2022 |

* cited by examiner

*Primary Examiner* — Moazzam Hossain
*Assistant Examiner* — Hajar Kolahdouzan
(74) *Attorney, Agent, or Firm* — Wells St. John P.S.

(57) ABSTRACT

Some embodiments include an integrated assembly having a stack of alternating first and second levels. A panel extends through the stack. The first levels have proximal regions adjacent the panel, and have distal regions further from the panel than the proximal regions. The distal regions have first conductive structures, and the proximal regions have second conductive structures. Detectable interfaces are present where the first conductive structures join to the second conductive structures. Some embodiments include methods of forming integrated assemblies.

29 Claims, 23 Drawing Sheets

INTEGRATED ASSEMBLIES AND METHODS OF FORMING INTEGRATED ASSEMBLIES

TECHNICAL FIELD

Integrated assemblies (e.g., integrated NAND memory). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_N$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

It can be desired to have voids between conductive structures to reduce, or even eliminate, capacitive coupling and/or other cross-talk mechanisms between the conductive structures. Some embodiments include integrated assemblies having voids between conductive structures. Some embodiments include methods of forming integrated assemblies. Example embodiments are described with reference to FIGS. 5-17.

Figure 1:
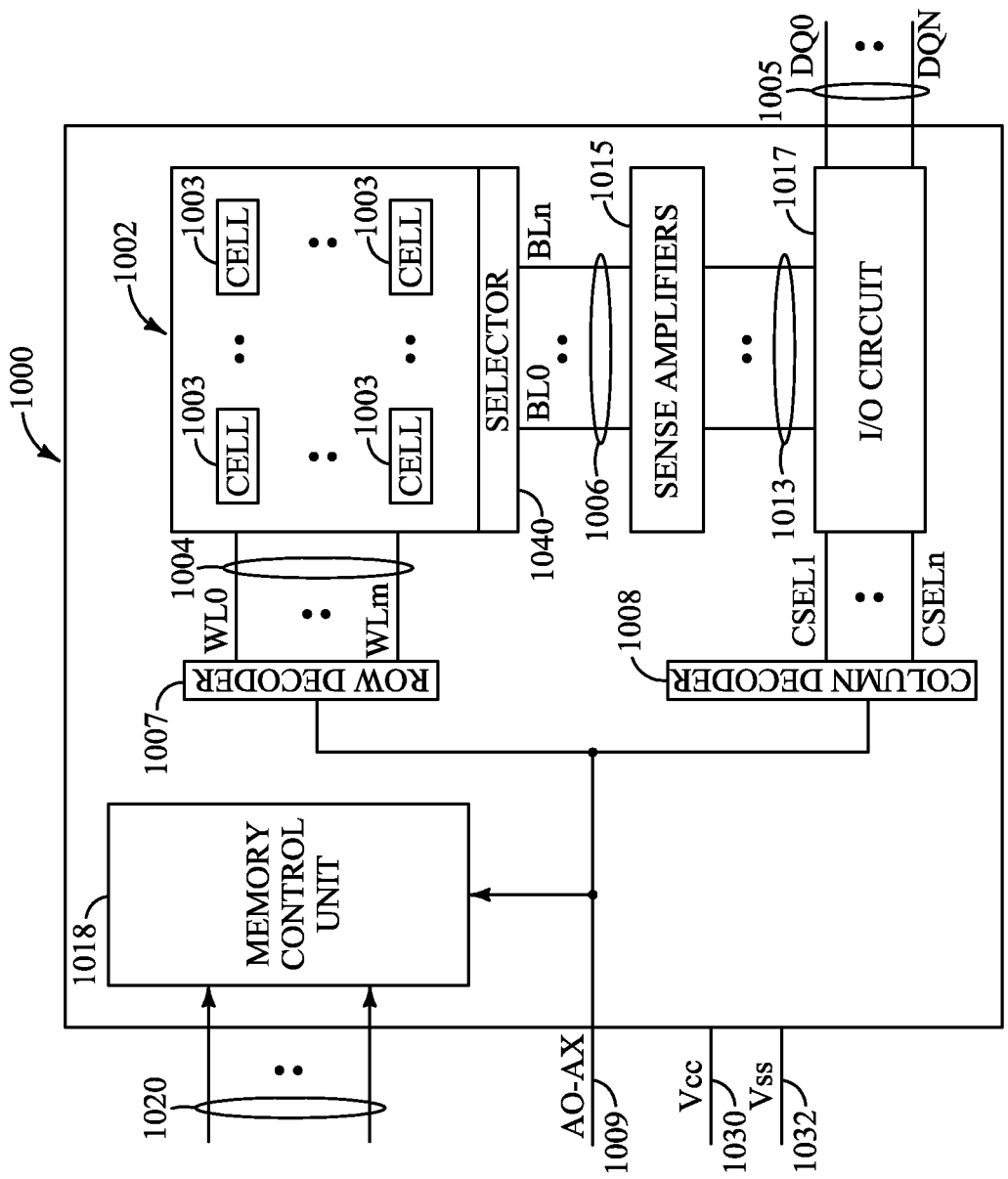
FIG. 1 shows a block diagram of a prior art memory device having a memory array with memory cells.
Figure 2:
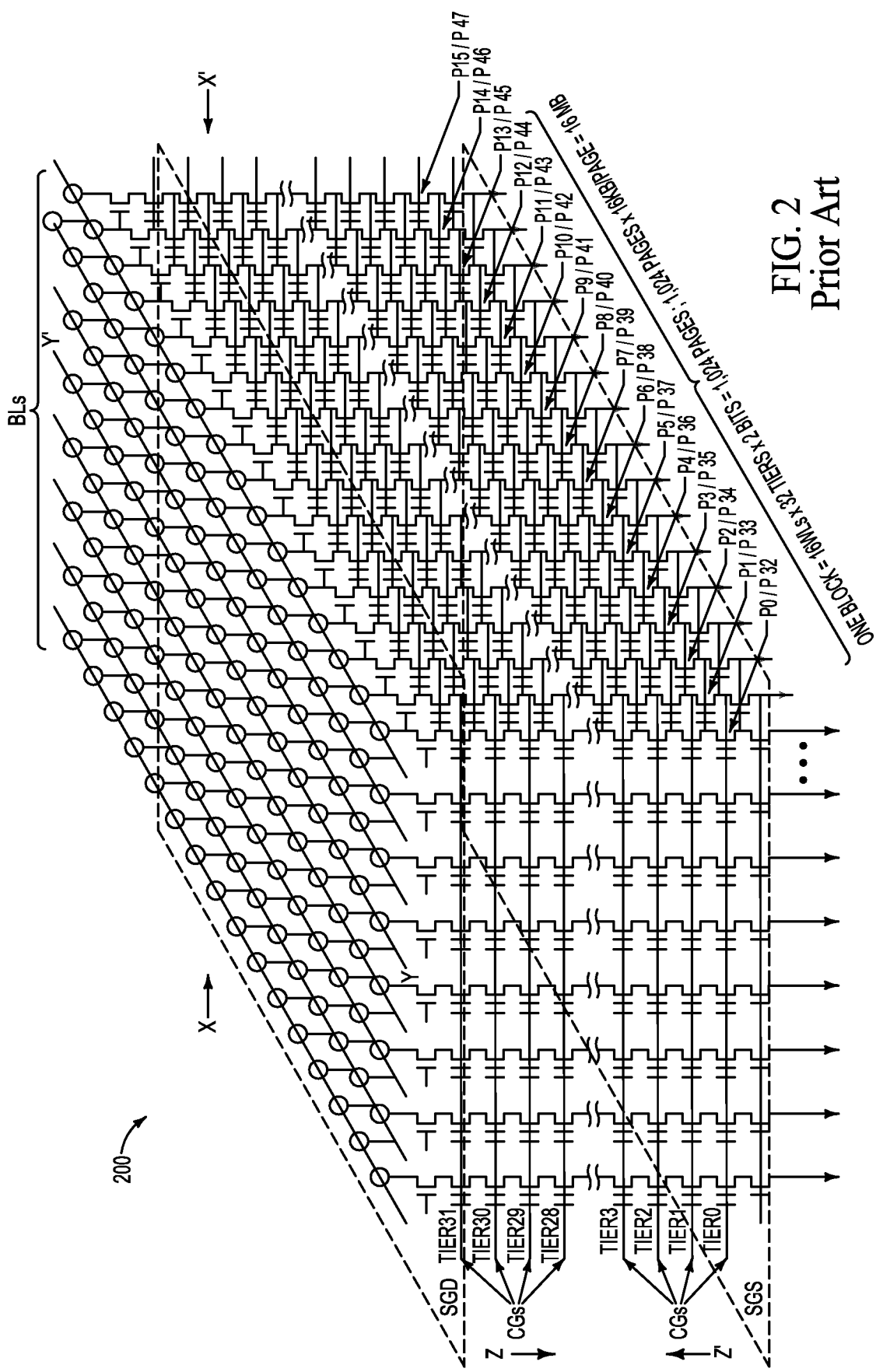
FIG. 2 shows a schematic diagram of the prior art memory array of FIG. 1 in the form of a 3D NAND memory device.
Figure 3:
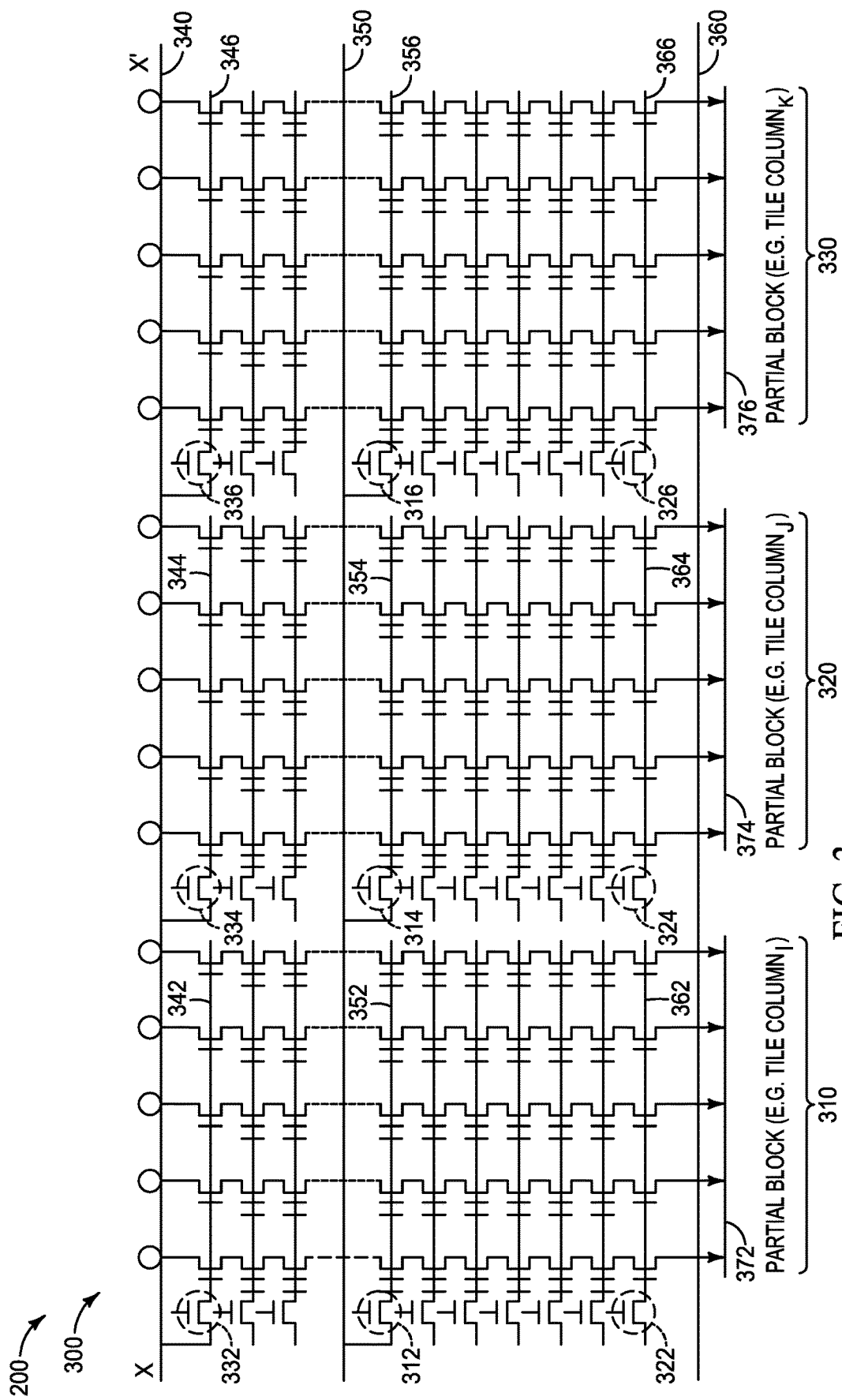
FIG. 3 shows a cross-sectional view of the prior art 3D NAND memory device of FIG. 2 in an X-X' direction.
Figure 4:
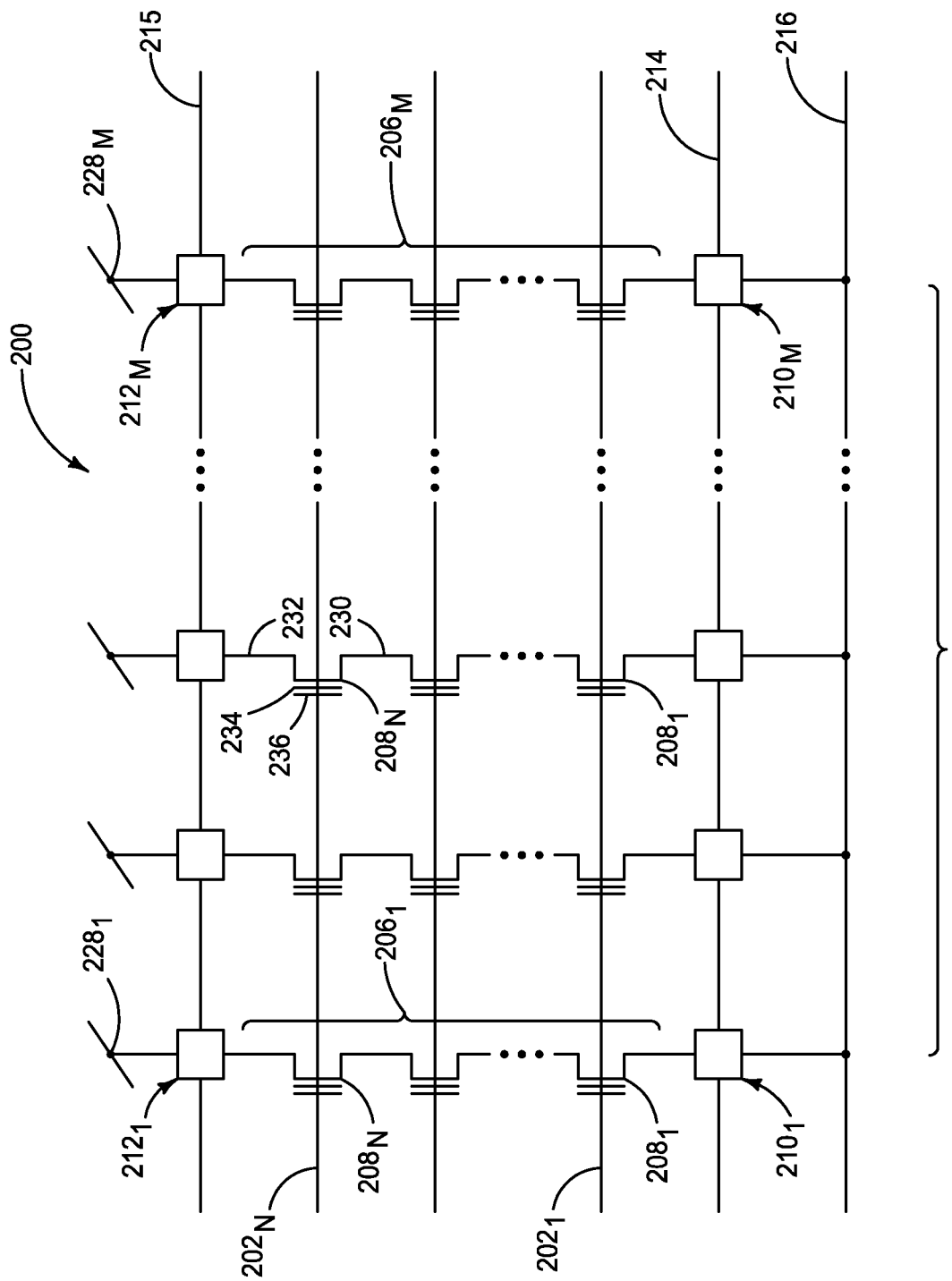
FIG. 4 is a schematic diagram of a prior art NAND memory array.
Figure 5:
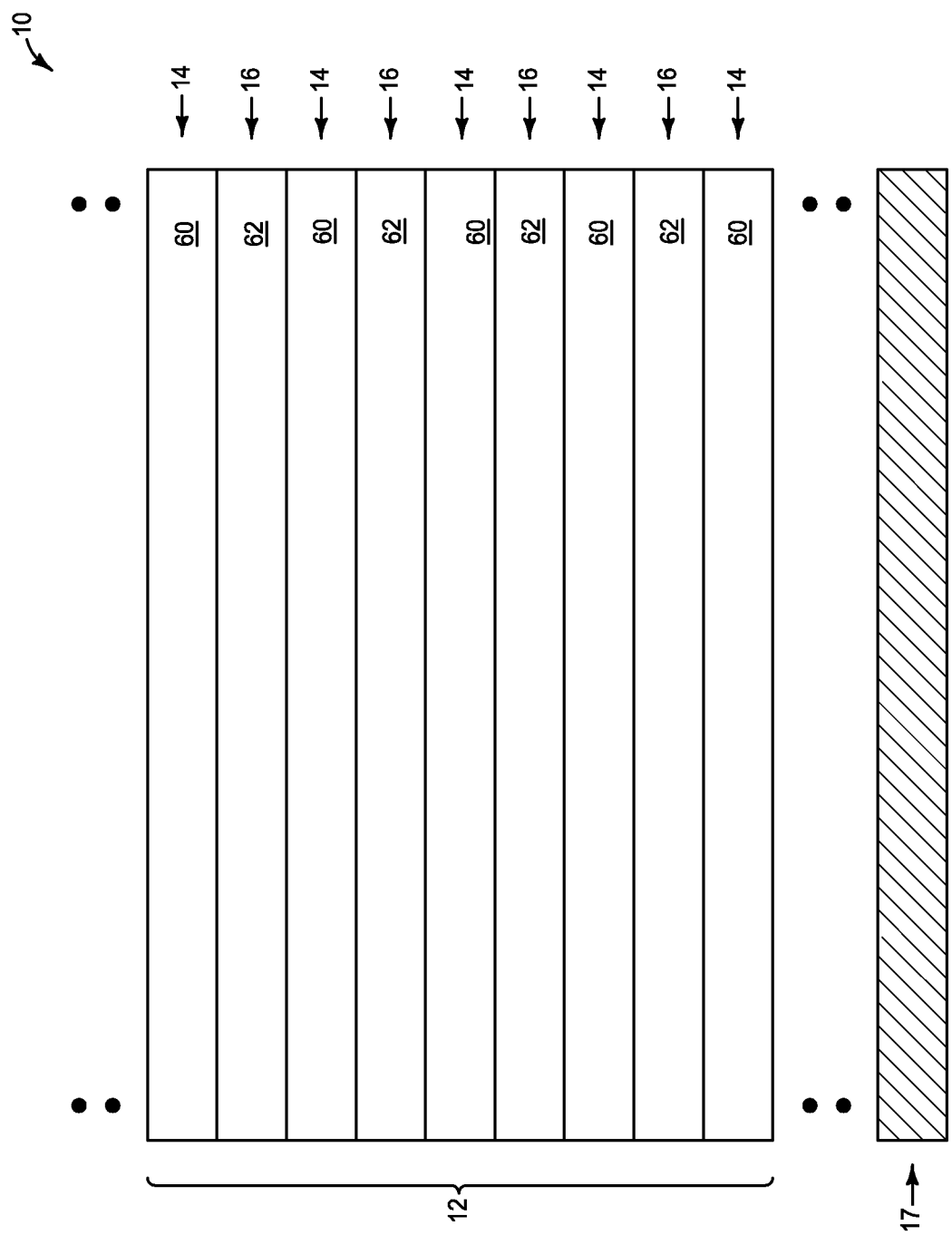
FIGS. 5 and 6 are diagrammatic cross-sectional side views of a region of an integrated assembly shown at example sequential process stages of an example method for forming an example NAND memory array.

FIG. 5 shows a region of an integrated assembly (structure, construction) 10 at an example process stage during the fabrication of memory cells.

The assembly 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon nitride; and the second material 62 may comprise, consist essentially of, or consist of silicon dioxide. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have vertical thicknesses within a range of from about 10 nm to about 50 nm. In some embodiments, the first and second levels 14 and 16 may have vertical thicknesses within a range of from about 15 nm to about 40 nm, within a range of from about 15 nm to about 20 nm, etc. There may be any suitable number of levels 14 and 16 within the stack 12. In some embodiments, there may be more than 10 of the levels within the stack, more than 50 of the levels within the stack, more than 100 of the levels within the stack, etc.

The stack 12 is shown to be supported by (formed over) a source structure 17.

The source structure 17 may correspond to source structures described with reference to FIGS. 1-4, and may be a line, an expanse, or any other suitable configuration. The source structure 17 may comprise any suitable materials, and in some applications may comprise conductively-doped semiconductor material (e.g., conductively-doped silicon) over metal-containing material (e.g., tungsten silicide).

The source structure 17 may be supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A gap is provided between the stack 12 and the source structure 17. The gap is utilized to indicate that other components and materials may be provided between the illustrated region of the stack 12 and the source structure 17. Such other components and materials may comprise additional levels of the stack, source-side select gates (SGSs), etc. Similarly, a gap is provided over the stack to indicate that the stack may extend upwardly beyond the illustrated region of the stack, and to indicate that other components and materials (e.g., bitlines, drain-side select gates (SGDs), etc.) may be provided over the illustrated region of the stack.

Figure 6:
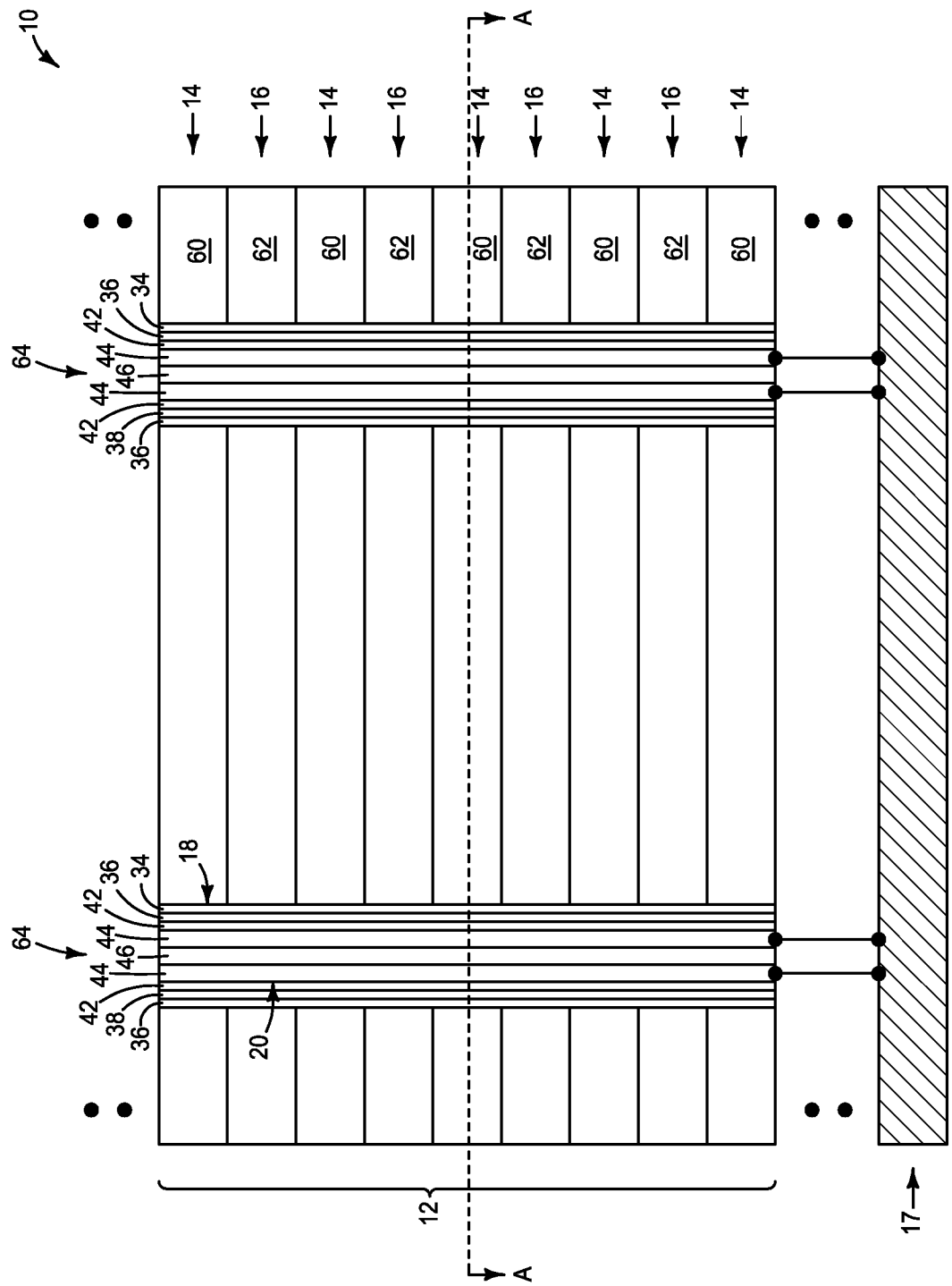
Figure 6A:
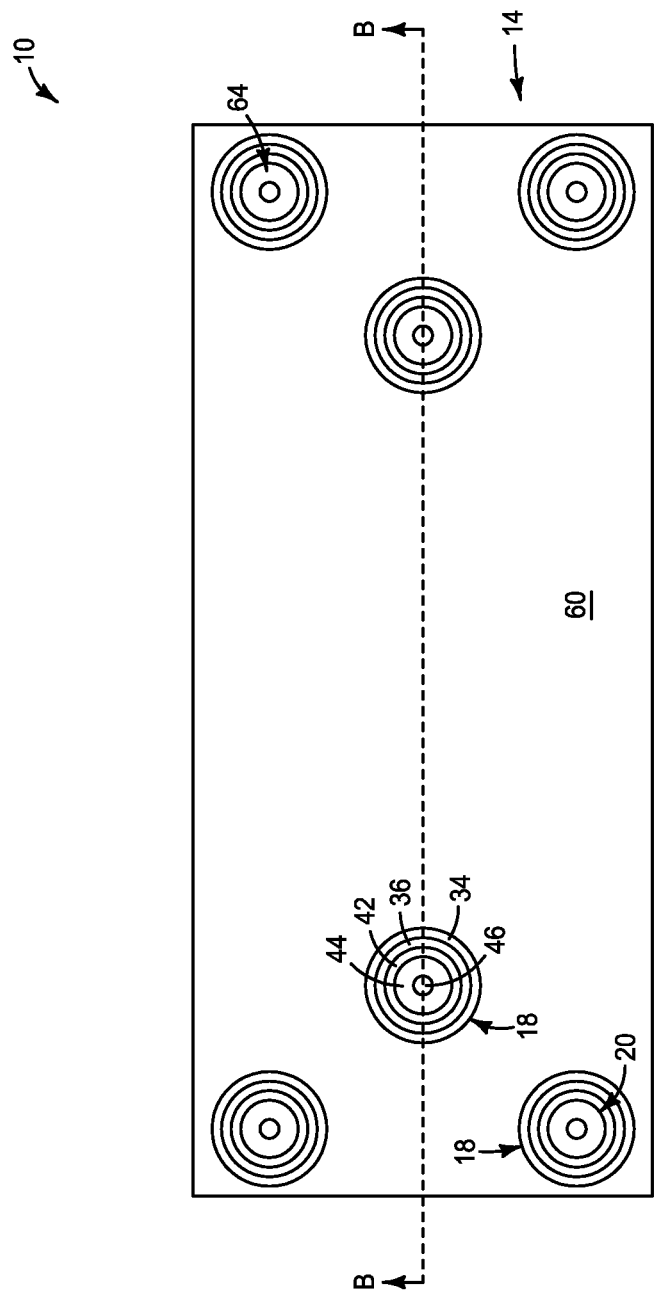
FIG. 6A is a diagrammatic top-down view of a portion of the integrated assembly of FIG. 6. The view of FIG. 6 is along the line B-B of FIG. 6, and the view of FIG. 6A is along the line A-A of FIG. 6.

Referring to FIGS. 6 and 6A, openings 64 are formed to extend through the stack 12. The openings 64 may have any suitable shape along the top-down view of FIG. 6A, and may be circular (as shown), elliptical, square or other polygonal, etc.

The openings 64 may be representative of a large number of substantially identical openings formed at the process stage of FIGS. 6 and 6A. The term "substantially identical" means identical to within reasonable tolerances of fabrication and measurement.

Cell materials (memory cell materials) 34, 36, 42 and 44 are formed within the openings 64.

The cell material 34 is charge-blocking material. The charge-blocking material 34 may comprise any suitable composition(s); and in some embodiments may comprise, consist essentially of, or consist of one or both of silicon oxynitride (SiON) and silicon dioxide ($SiO_2$).

The material 36 is charge-storage material. The charge-storage material 36 may comprise any suitable composition(s). In some embodiments the charge-storage material 36 may comprise one or more charge-trapping materials, such as, for example, one or more of silicon nitride, silicon oxynitride, conductive nanodots, etc. For instance, the charge-storage material 36 may comprise, consist essentially of, or consist of silicon nitride.

The material 42 is gate-dielectric material (i.e., tunneling material, charge-passage material). The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

The material 44 is channel material. The channel material 44 comprises semiconductor material, and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

In the illustrated embodiment, insulative material 46 is formed adjacent the channel material 44, and fills central regions of the openings 64. The insulative material 46 may comprise any suitable composition(s); and in some embodiments may comprise, consist essentially of, or consist of silicon dioxide. The illustrated embodiment of FIGS. 6 and 6A, shows the channel material 44 configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

The channel material 44 is shown to be electrically coupled with the source structure 17 in the cross-sectional view of FIG. 6. Such electrical coupling may be accomplished with any suitable configuration. For instance, in some embodiments the channel material 44 may directly contact the source structure 17.

The materials 34, 36, 42 and 44 may be considered to be configured as cell-material-pillars 18 which extend vertically through the stack 12. In the shown embodiment, the cell-material-pillars 18 also include the insulative material 46.

The channel material 44 may be considered to be configured as channel-material-pillars 20 which extend vertically through the stack 12, with such channel-material-pillars being incorporated into the cell-material-pillars 18.

The illustrated cell-material-pillars 18 may be considered to be representative of a large number of substantially identical cell-material-pillars 18 that may be formed at the processing stage of FIGS. 6 and 6A. For instance, in some embodiments there may be hundreds, thousands, hundreds of thousands, millions, hundreds of millions, etc., of the cell-material-pillars formed at the processing stage of FIGS. 6 and 6A.

The lateral thicknesses of the materials 34, 36, 42, 44 and 46 of FIGS. 6 and 6A are for illustrative purposes only. In practice, the relative lateral thicknesses of such materials may be different than shown.

Figure 7:
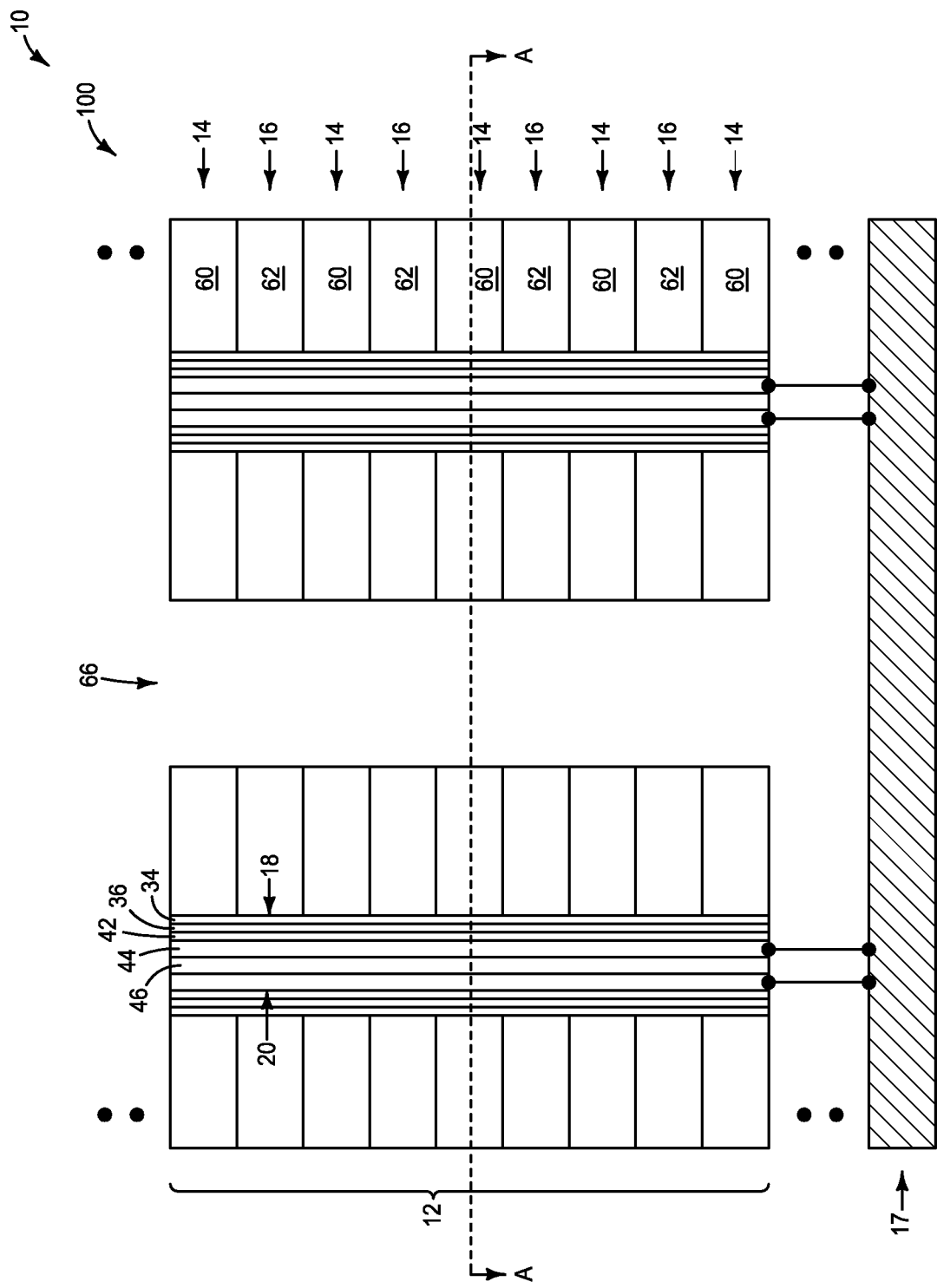
FIG. 7 is a diagrammatic cross-sectional side view of the region of the integrated assembly of FIG. 5 shown at an example process stage following that of FIG. 6.
Figure 7A:
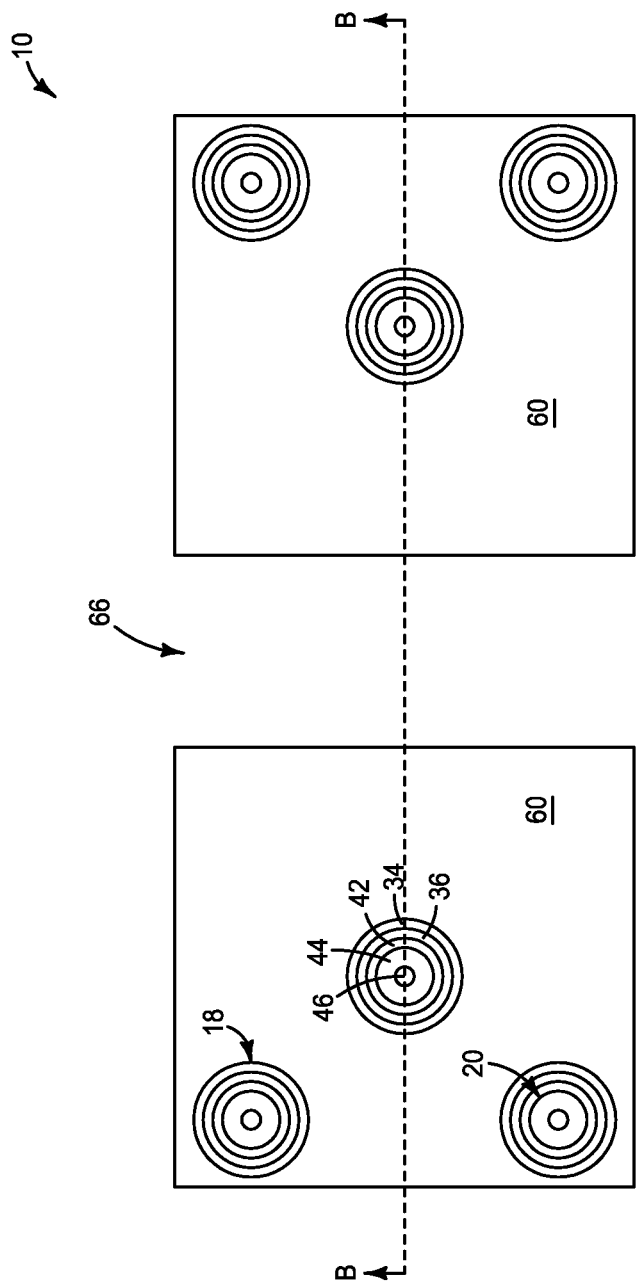
FIG. 7A is a diagrammatic top-down view of a portion of the integrated assembly of FIG. 7. The view of FIG. 7 is along the line B-B of FIG. 7A, and the view of FIG. 7A is along the line A-A of FIG. 7.

Referring to FIGS. 7 and 7A, a slit 66 is formed to extend through the stack 12. The slit 66 may be utilized to separate memory-block regions from one another in some embodiments. The illustrated slit 66 may be representative of a large number of substantially identical slits formed at the process stage of FIGS. 7 and 7A.

Figure 8:
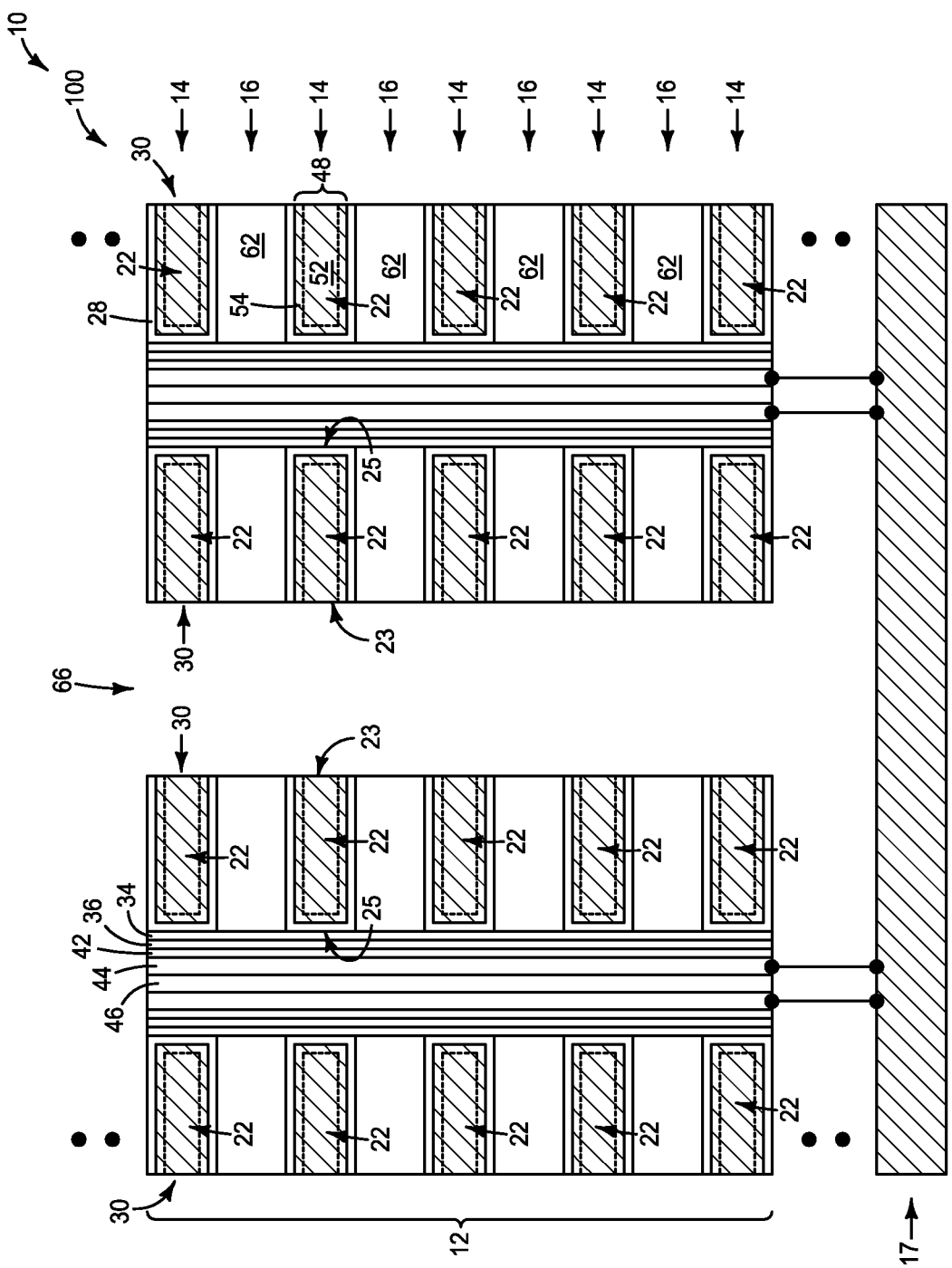
FIGS. 8-10 are diagrammatic cross-sectional side views of the region of the integrated assembly of FIG. 5 shown at example sequential process stages following that of FIG. 7.

Referring to FIG. 8, the first material 60 (FIG. 7) is removed, which leaves voids 30 along the first levels 14 (i.e., between the second levels 16), and subsequently the voids 30 are filled with conductive material 48 and dielectric material 28.

The voids 30 may be referred to as first voids, and may be formed with any suitable process which removes the material 60 (FIG. 7) selectively relative to the materials 62 and 34. In some embodiments such process may utilize etchant (e.g., hot phosphoric acid) flowed into the slit 66.

The dielectric material 28 may be high-k dielectric material, and may be referred to as dielectric-barrier material. The term "high-k" means a dielectric constant greater than that of silicon dioxide (i.e., greater than about 3.9). In some embodiments, the high-k dielectric material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries. The high-k dielectric material 28 may be formed to any suitable thickness; and in some embodiments may be formed to a thickness within a range of from about 1 nm to about 5 nm.

The conductive material 48 may comprise a single homogeneous composition, or may comprise a laminate of two or more different compositions. In the illustrated embodiment, dashed lines are provided within the conductive material 48 to indicate that the material 48 may comprise a conductive core material 52 and a liner material 54 along an outer periphery of the core material.

The conductive core material 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive core material 52 may comprise one or more metals (e.g., may comprise tungsten).

The conductive liner material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, conductive liner material 54 may comprise one or more metal nitrides (e.g., may comprise titanium nitride, tungsten nitride, etc.).

In some embodiments, the dielectric-barrier material 28 may be considered to be along an outer periphery of the conductive liner material 54.

In some embodiments, the stack 12 of FIG. 8 may be considered to comprise alternating first and second levels 14 and 16, with the first levels 14 including the conductive material 48 and the dielectric-barrier material 28. The conductive material 48 may be considered to be configured as first conductive structures 22 along the first levels 14. Some of the first conductive structures 22 are adjacent to the slit 66; and such first conductive structures may be considered to have proximal ends 23 adjacent to the slit 66, and to have distal ends 25 in opposing relation to the proximal ends 23.

Figure 9:
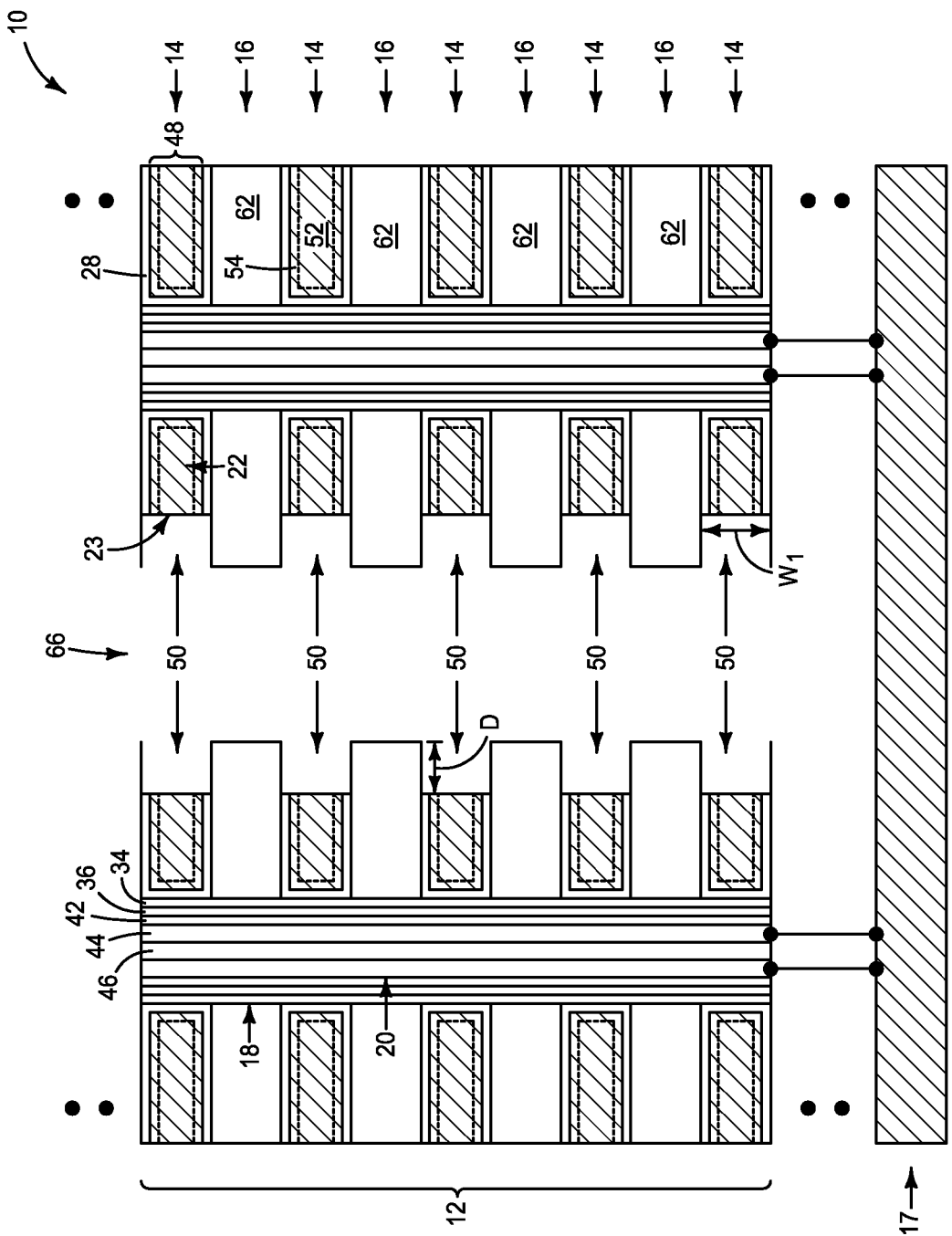

Referring to FIG. 9, the proximal ends 23 are recessed to form cavities 50 adjacent to the slit 66 along the first levels 14. The cavities may have any suitable lateral depth D, including, for example, a lateral depth within a range of from about 10 nm to about 20 nm.

Figure 10:
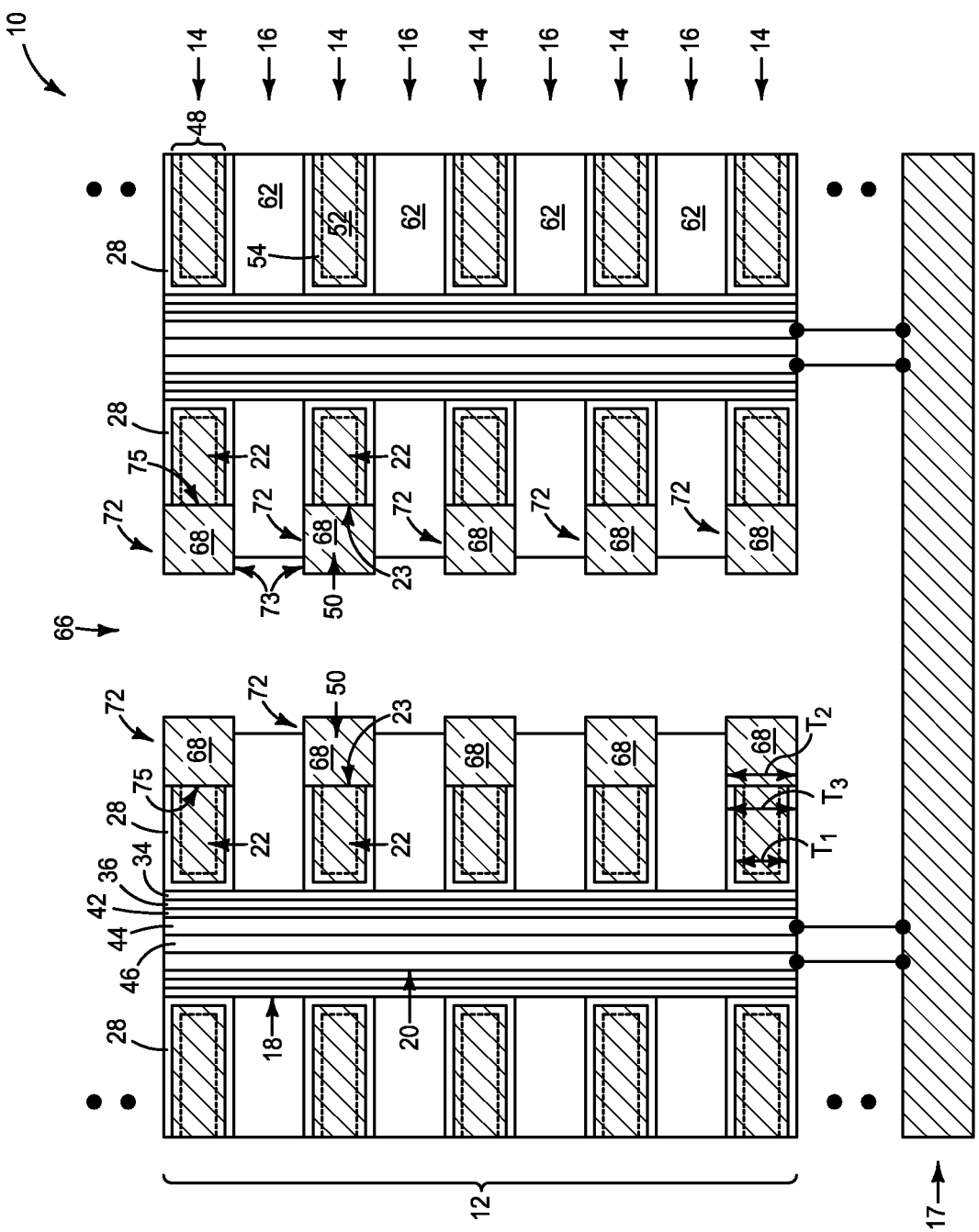

Referring to FIG. 10, conductive material 68 is formed within the cavities 50. The conductive material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, metal boride, etc.), and/or conductively-doped semiconductor materials (e.g., conductively-doped silicon, conductively-doped germanium, etc.). In some embodiments, the conductive material 68 may comprise, consist essentially of, or consist of one or more of titanium, cobalt, nickel, tungsten and ruthenium.

The conductive material 68 may be selectively grown to extend laterally from the conductive material 48 (e.g., to extend laterally from one or both of the materials 52 and 54 of the indicated example configuration of the conductive material 48). Such may be accomplished utilizing, for example, one or both of atomic layer deposition (ALD) and chemical vapor deposition (CVD), and may utilize growth promotor (accelerant) along surfaces of conductive material 48 and/or growth inhibitor (poison) along surfaces of the insulative material 62. Alternatively, the conductive material 68 may be grown non-selectively along sidewalls of the slit 66, and then excess material 68 may be removed with suitable etching while leaving the material 68 within the cavities 50.

The conductive material 68 may be a single homogenous composition (as shown) or may be a laminate of two or more different compositions.

The conductive material 68 forms second conductive structures 72. The second conductive structures 72 are provided between the slit 66 and the recessed proximal ends 23 of the first conductive structures 22. In the shown embodiment, the second conductive structures 72 have lateral regions 73 projecting into the slit 66 (e.g., extending laterally outwardly beyond edges of the insulative material 62). In other embodiments (e.g., an embodiment described below with reference to FIG. 13), the second conductive structures 72 may be entirely retained in the cavities 50 rather than having regions projecting into the slit 66.

The conductive material 68 of the structures 72 vertically overlaps the dielectric material 28 along the first levels 14. Such may occur regardless of whether the conductive material 68 is formed selectively along the conductive material 48 or not, due to, for example, overgrowth of the material 68 in embodiments in which the material 68 is selectively grown along the material 48.

Figure 10A:
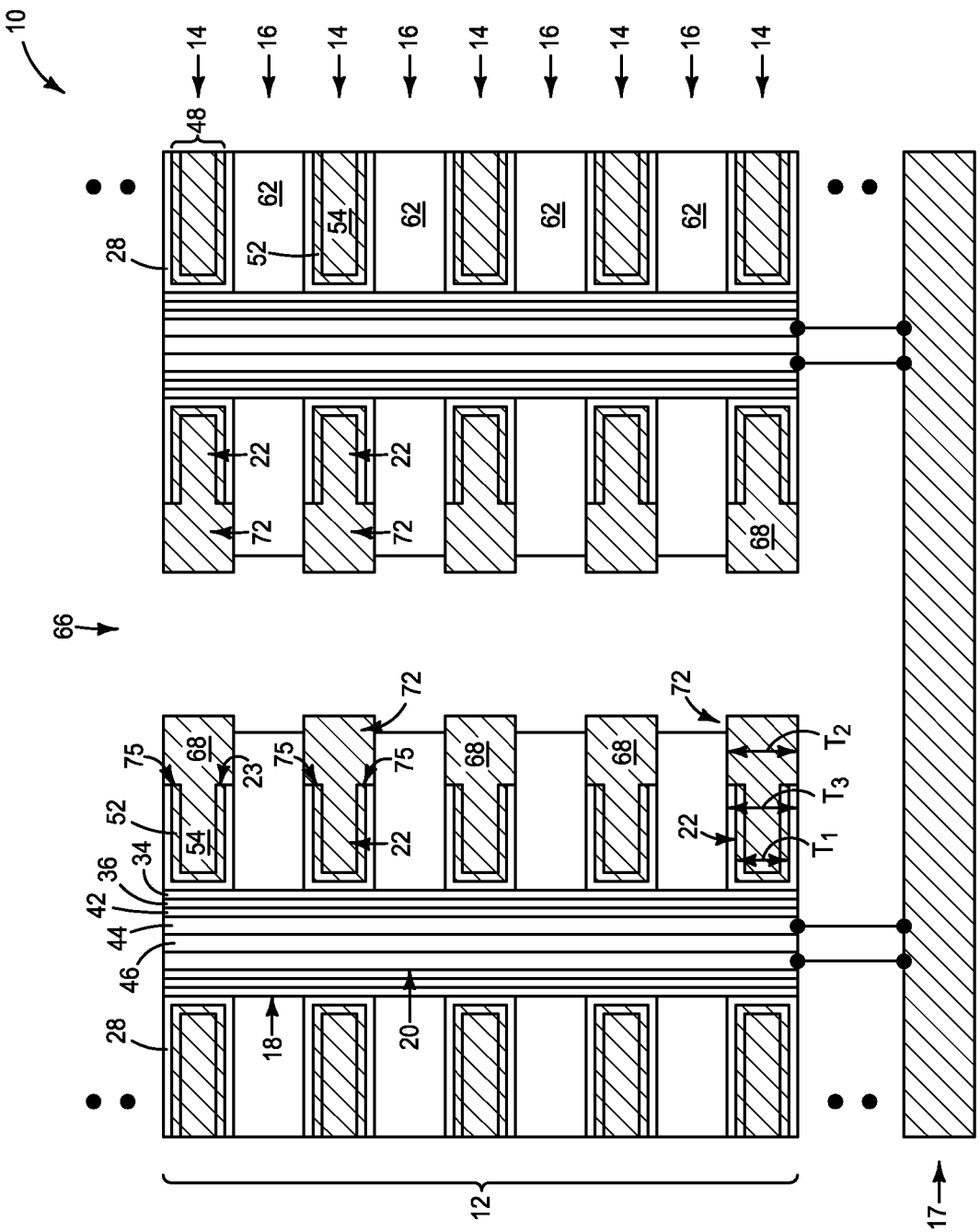
FIGS. 10A and 10B are diagrammatic cross-sectional side views of the region of the integrated assembly of FIG. 5 shown at alternative example process stages relative to the process stage of FIG. 10.
Figure 10B:
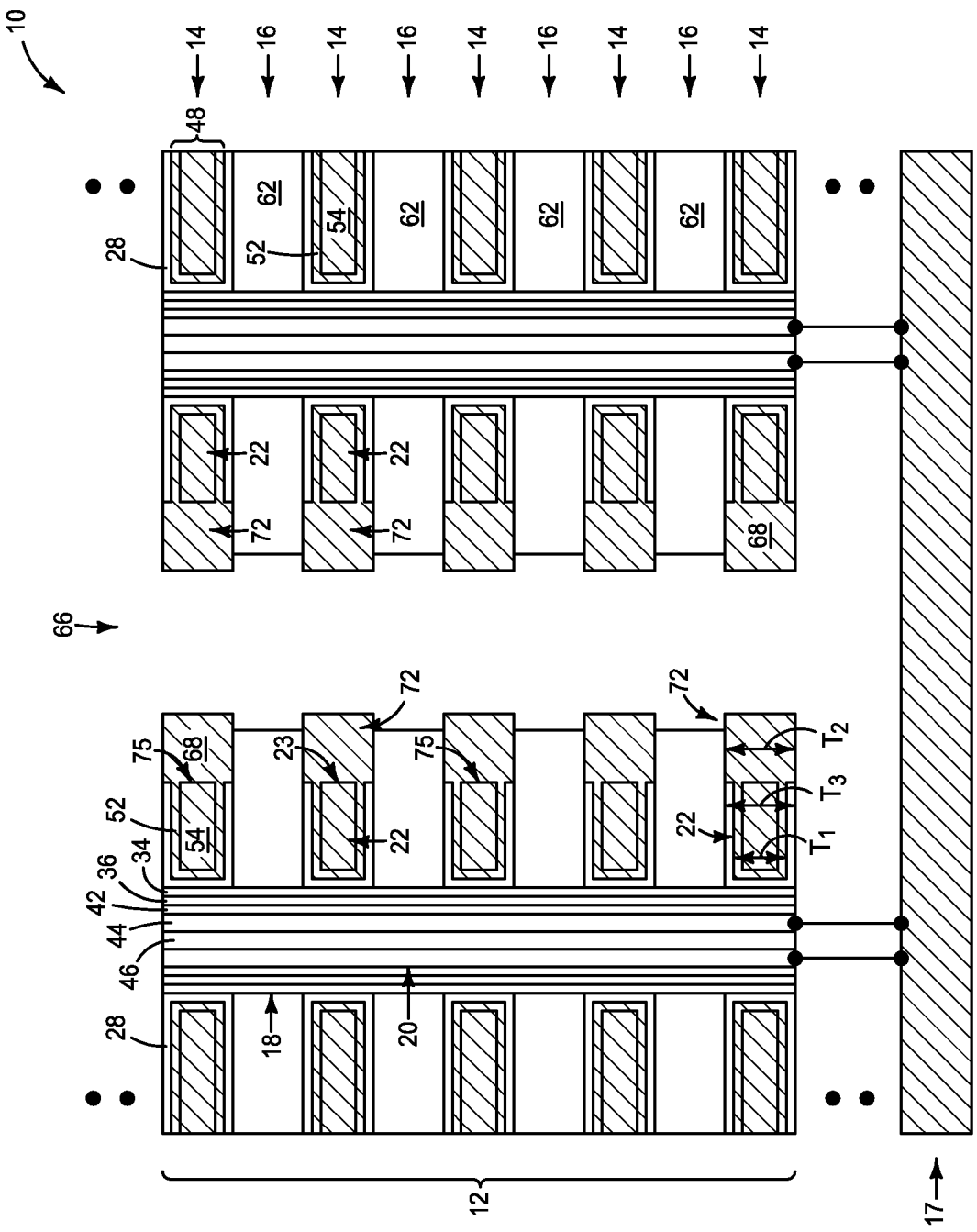

Detectable interfaces 75 may be present where the second conductive structures 72 join with the first conductive structures 22, and may result from compositional differences between the conductive material 68 of the second conductive structures 72 and the conductive material 48 of the first conductive structures 22. The material 68 may be different than the entirety of the material 48, as shown in FIG. 10. In other embodiments, the material 68 may be different than only a portion of the material 48, as shown in FIGS. 10A and 10B. FIG. 10A shows an embodiment in which the material 68 is the same as the core material 52 of the conductive structures 22 (e.g., in which the materials 68 and 52 both comprise tungsten), and FIG. 10B shows an embodiment in which the material 68 is the same as the liner material 54 of the conductive structures 22 (e.g., in which the materials 68 and 54 both comprise titanium nitride and/or tungsten nitride). The dashed lines between the materials 52 and 54 of FIG. 10 are replaced with solid lines in FIGS. 10A and 10B to indicate that the materials 52 and 54 are actual in FIGS. 10A and 10B, rather than optional as shown in the embodiment of FIG. 10.

The embodiment of FIG. 10 has the detectable interfaces 75 extending entirely along the proximal surfaces 23 of the first conductive structures 22. In contrast, the embodiments of FIGS. 10A and 10B have the detectable interfaces 75 extending only along portions of the proximal surfaces 23 of the first conductive structures 22. A detectable interface is an interface that may be detected with any reasonable procedure. In some embodiments the detectable interfaces may be referred to simply as interfaces, may be referred to as discernable interfaces (or as discernable interface locations), as distinguishable locations, measurable locations, observable locations, etc.

The embodiments of FIGS. 10-10B show the first conductive structures 22 to have first thicknesses (vertical dimensions) $T_1$, and show the second conductive structures 68 to have a second vertical thicknesses (vertical dimensions) $T_2$. The second vertical dimensions $T_2$ may be at least about as large as the first vertical dimensions $T_1$. In some embodiments, the dielectric-barrier material 28 may be omitted from the levels 14, and in such embodiments the conductive structures 72 would have the same vertical dimensions as the conductive structures 22 in the illustrated configurations of FIGS. 10-10B. However, in the shown embodiments the dielectric-barrier material 28 is provided within the levels 14, and such levels may be considered to have overall thicknesses $T_3$ which encompass the conductive structures 22 and the dielectric material 28. The thickness $T_2$ of the second conductive structures 72 may be at least about as large as the overall thickness $T_3$.

The second conductive structures 72 may have any suitable shapes, and in the illustrated embodiment are rectangular-shaped along the cross-sectional views of FIGS. 10-10B.

Figure 11:
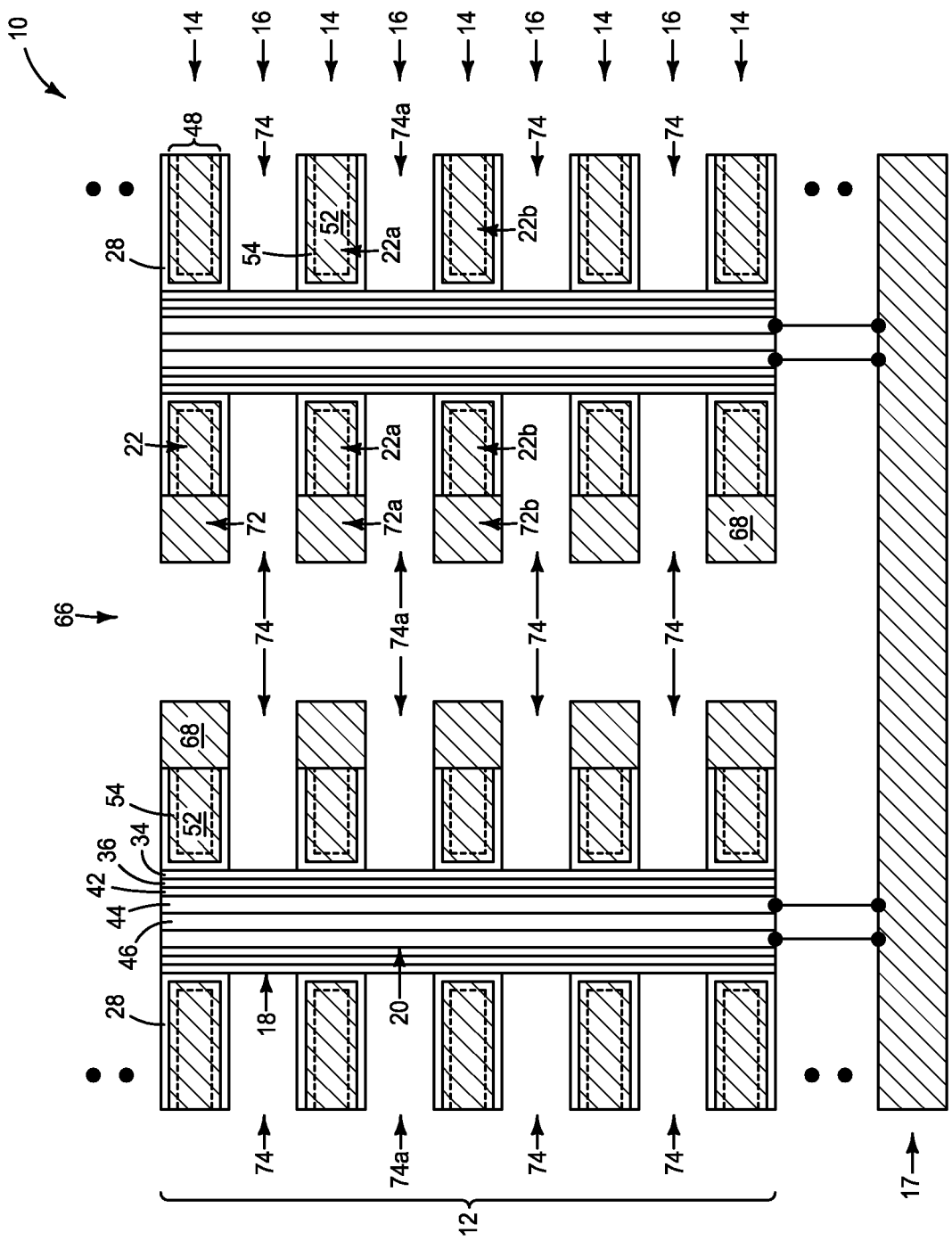
FIGS. 11 and 12 are diagrammatic cross-sectional side views of the region of the integrated assembly of FIG. 5 shown at example sequential process stages following that of FIG. 10.

Referring to FIG. 11, the second material 62 (FIG. 10) is removed to leave voids 74 along the levels 16. The voids 74 may be considered to be between vertically-neighboring first conductive structures 22, and between vertically-neighboring second conductive structures 72. For instance, a pair of vertically-neighboring first conductive structures 22 are labeled as 22a and 22b, and one of the voids 74 is labeled as 74a and is shown to be provided between (i.e., to be formed between) such vertically-neighboring first conductive structures. Also, a pair of vertically-neighboring second conductive structures 72 are labeled as 72a and 72b, and the void 74a is shown to be provided between such vertically-neighboring second conductive structures.

The voids 74 may be referred to as second voids to distinguish them from the first voids 30 described above with reference to FIG. 8.

In some embodiments, the second voids 74 may be formed by flowing one or more suitable etchants into the slit 66.

Figure 12:
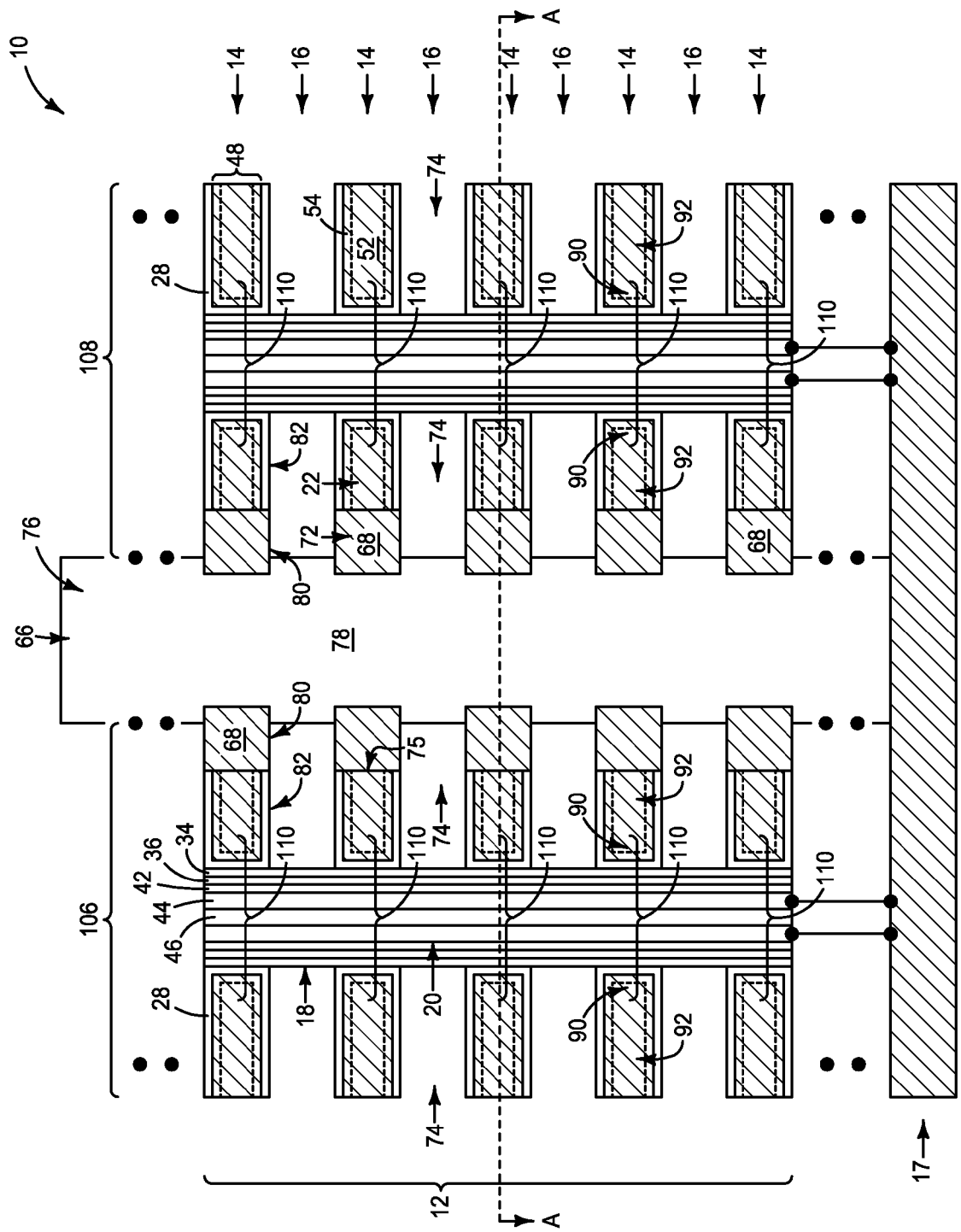
Figure 12A:
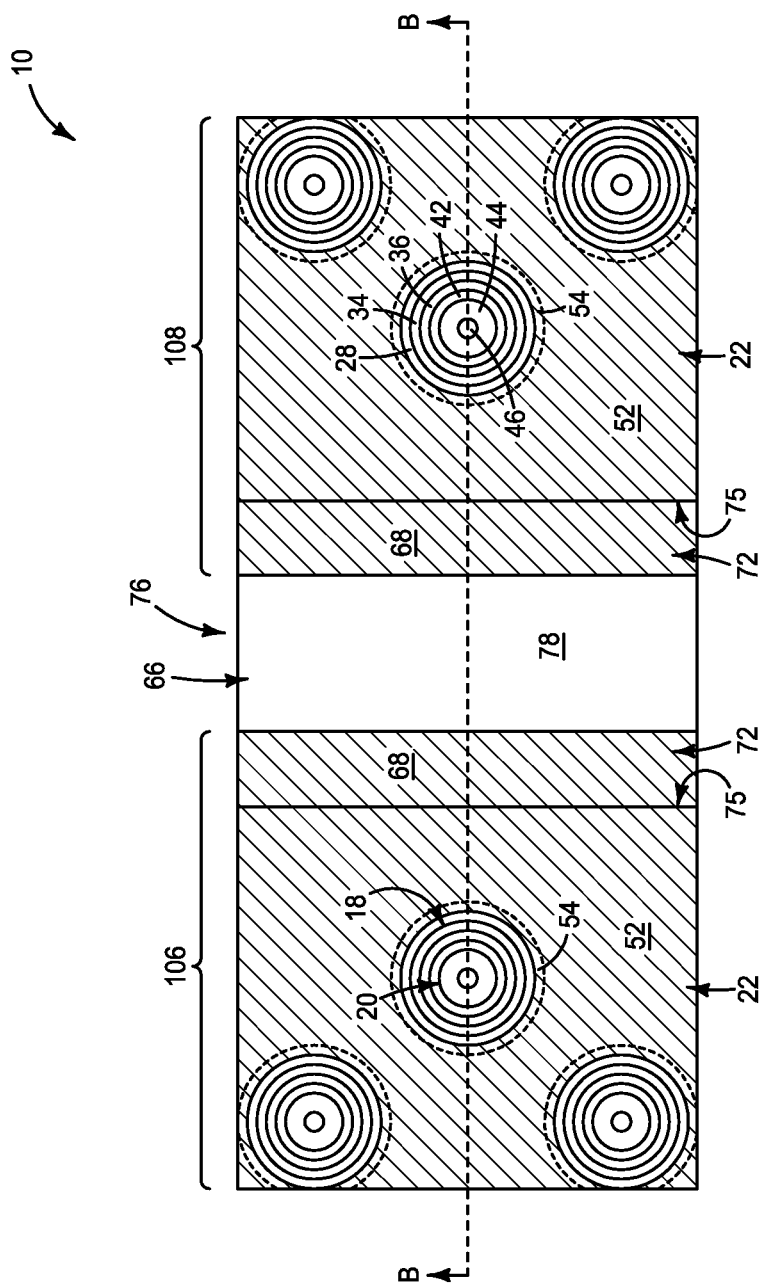
FIG. 12A is a diagrammatic top-down view of a portion of the integrated assembly of FIG. 12. The view of FIG. 12 is along the line B-B of FIG. 12A, and the view of FIG. 12A is along the line A-A of FIG. 12.

Referring to FIGS. 12 and 12A, a panel 76 is formed within the slit 66. The panel comprises panel material 78. The panel material 78 may comprise any suitable composition(s), and in some embodiments may comprise, consist essentially of, or consist of silicon dioxide. Although the panel 76 is shown to comprise a single homogeneous material, in other embodiments the panel may comprise a laminate of two or more different materials.

The panel 76 may divide the pillars 18 between a first block region 106 and a second block region 108. Each of the pillars 18 may be considered to be associated with a vertical stack of memory cells (e.g., NAND memory cells) 110. Accordingly, the memory cells 110 on one side of the panel 76 may be considered to be within the first block region (memory-block-region) 106, and the memory cells 110 on the other side of the panel 76 may be considered to be within the second block region (memory-block-region) 108. The block regions 106 and 108 may be analogous to the memory blocks (or memory sub-blocks) described above in the "Background" section of this disclosure.

In some embodiments, the stack 12 of FIG. 12 may be considered to include alternating first and second levels 14 and 16, or alternatively to comprise void levels 16 alternating with non-void levels 14. The non-void levels (first levels) 14 may be considered to have proximal regions 80 adjacent the panel 76, and to have distal regions 82 further from the panel 76 then the proximal regions. The distal regions 82 comprise the first conductive structures 22, and the proximal regions 80 comprise the second conductive structures 72.

In the illustrated embodiment, the panel material 78 extends partially into the voids 74, and extends between vertically-neighboring conductive structures 72. However, the panel material does not extend far enough into the voids 74 to be between the vertically-neighboring conductive structures 22. In some embodiments, an advantage of the configuration of FIG. 12 is that the voids 74 are provided fully between vertically-neighboring first conductive structures 22, rather than having some portions of the conductive structures 22 adjacent to insulative material 78 from the panel 66. Accordingly, the electrical separation between vertically-neighboring conductive structures 22 remains consistent across the entirety of the conductive structures 22, rather than changing in regions neighboring to the panel 76 as can happen in conventional configurations lacking the second conductive structures 72 between the first conductive structures 22 and the panel 76. In some aspects, the airgap volume (void volume) between vertically-neighboring conductive structures 22 may be larger in configurations formed in accordance with embodiments described herein as compared to conventional configurations lacking the second conductive structures 72 due to, at least in part, the lack of encroachment of the panel material 78 into regions directly between the first conductive structures 22. The improved void volume may lead to improved electrical performance of vertically-adjacent wordlines (with the wordlines being the conductive structures 22) due to, at least in part, reduced crosstalk between the vertically-adjacent wordlines as compared to conventional configurations. Another advantage which may be achieved by utilizing the second conductive structures 72 between the first conductive structures 22 and the panel 76 is that there may be additional uniformity achieved from the bottom of the panel to the top of the panel relative to configurations lacking the second conductive structures 72. Such uniformity may include, for example, the extent to which the panel material 78 penetrates into the voids 74, and the associated consistency of seals provided by the panel 76 along the void regions 16. Further, the second conductive structures 72 may provide improved adhesion between the panel material 78 and the non-void levels 14 as compared to conventional configurations lacking the structures 72. Such may reduce cracking, bending and other problematic structural problems that may occur along interfaces of the panel 76 and the non-void levels 14 as compared to conventional configurations.

The non-void levels 14 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 14. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The NAND memory cells 110 comprise the dielectric-barrier material 28, the charge-blocking material 34, the charge-storage material 36, the gate-dielectric material 42 and the channel material 44. The illustrated NAND memory cells 110 form portions of vertically-extending strings of memory cells. Such strings may be representative of a large number of substantially identical NAND strings formed during fabrication of a NAND memory array (with the term "substantially identical" meaning identical to within reasonable tolerances of fabrication and measurement).

Each of the NAND memory cells 110 includes a control gate region 90 within a conductive structure 22 along a conductive level 14. The control gate regions 90 comprise control gates analogous to those described above with reference to FIGS. 1-4. The conductive structures 22 also comprise regions 92 adjacent to (proximate) the control gate regions 90. The regions 92 may be referred to as routing regions (wordline regions).

The configuration of FIGS. 12 and 12A may be a final structure of a memory arrangement (e.g., an assembly configured to include NAND memory).

In operation, the charge-storage material 36 may be configured to store information in the memory cells 110. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 90, and/or based on the value of voltage applied to the channel material 44.

The tunneling material 42 forms tunneling regions of the memory cells 110. Such tunneling regions may be configured to allow desired migration (e.g., transportation) of charge (e.g., electrons) between the charge-storage material 36 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 may provide a mechanism to block charge from flowing from the charge-storage material 36 to the associated gates 90.

The dielectric-barrier material (high-k material) 28 may be utilized to inhibit back-tunneling of charge carriers from the gates 90 toward the charge-storage material 36. In some embodiments, the dielectric-barrier material 28 may be considered to form dielectric-barrier regions within the memory cells 110.

Figure 13:
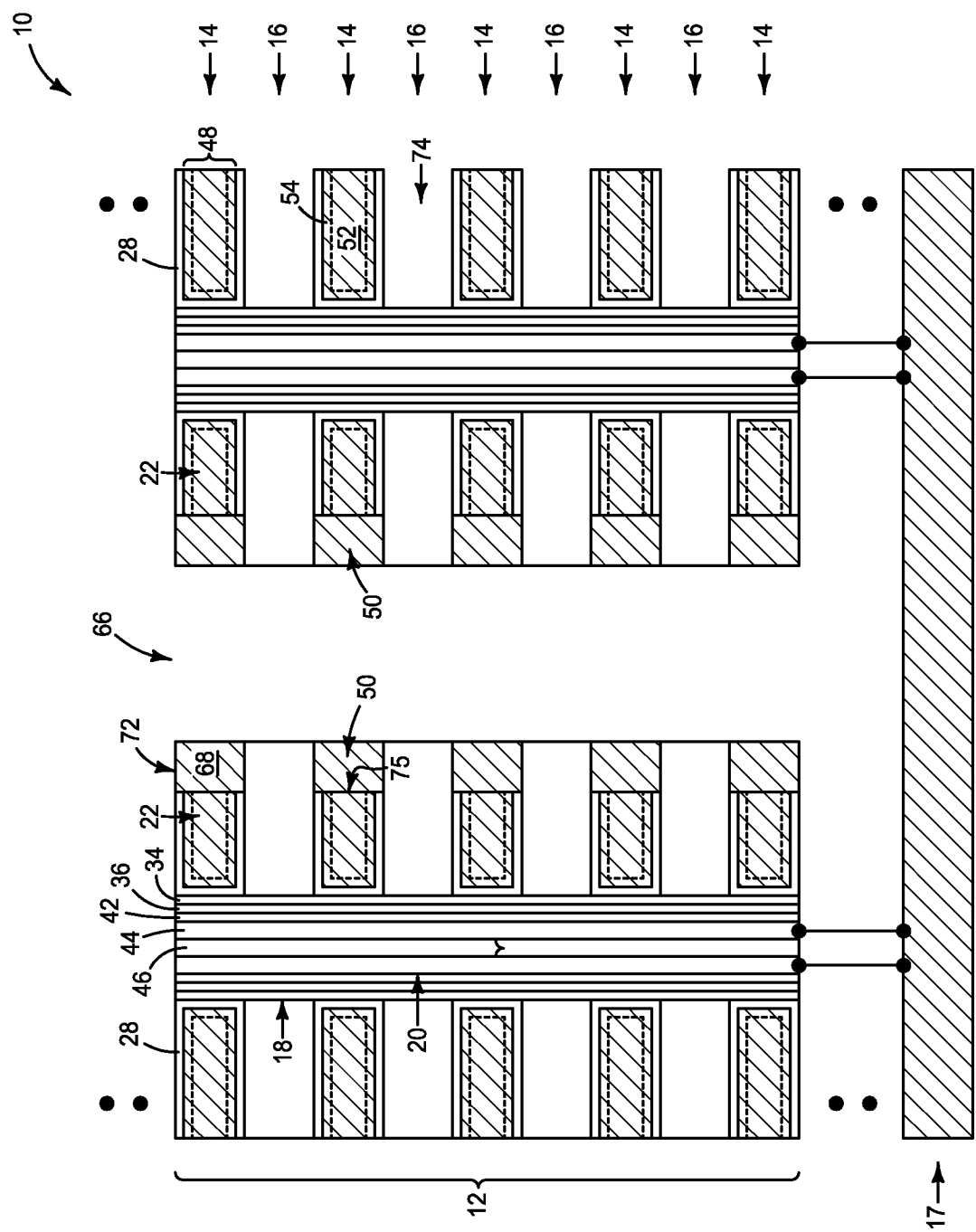
FIGS. 13 and 14 are diagrammatic cross-sectional side views of the region of the integrated assembly of FIG. 5 shown at example sequential process stages following that of FIG. 9, with the process stage of FIG. 13 being alternative to that of FIG. 10.

The embodiment of FIG. 10 shows a configuration in which the second conductive structures 72 project laterally beyond the cavities 50 (FIG. 9) and extend into the slit 66. FIG. 13 shows an alternative configuration in which the conductive structures 72 are entirely contained within the cavities 50. In some embodiments, the conductive material 68 of the structures 72 may comprise conductively-doped semiconductor material (e.g., conductively-doped silicon). The conductively-doped semiconductor material may be initially formed to fill the cavities 50 and to at least partially fill the slit 66. Subsequently, suitable etching may be utilized to remove excess of the conductively-doped semiconductor material from within the slit 66 while leaving the conductively-doped semiconductor material 68 within the cavities 50 to form the configuration of FIG. 13.

Figure 14:
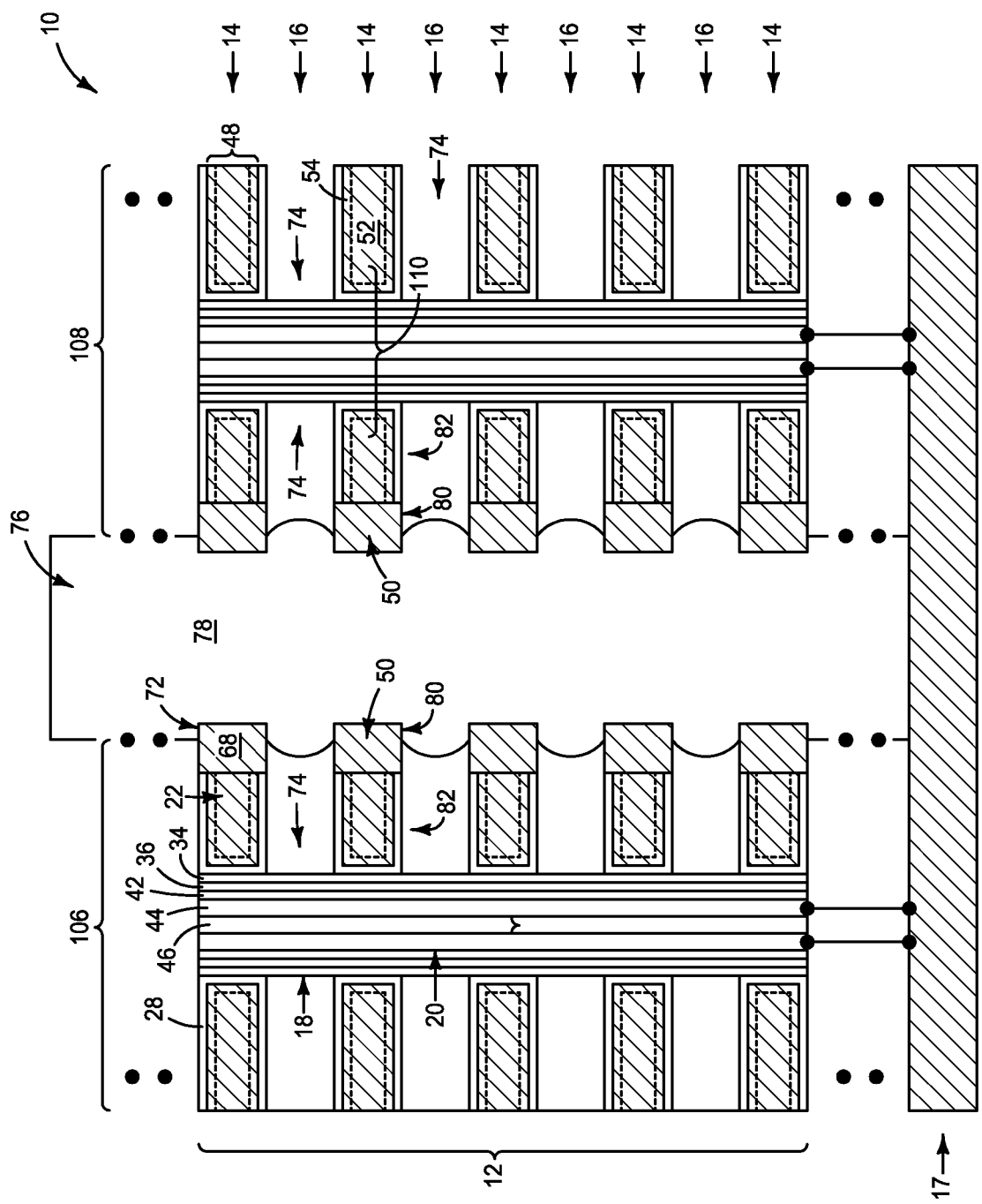

FIG. 14 shows a process stage which may follow that of FIG. 13, and shows the voids 74 and the panel 76 formed with processing analogous to that described with reference to FIGS. 11 and 12. The panel material 78 is shown to extend into the voids 74, but does not extend to the distal regions 82 of the first levels 14 (e.g., the regions adjacent the second conductive structures 22). The panel material 78 of FIG. 14 is shown to encroach further into the voids 74 than does the panel material 78 of FIG. 12. Such is to provide the reader with another example possibility of how the panel material 78 may be configured. In practice, the panel material 78 may be configured approximately as shown in FIG. 12, approximately as shown in FIG. 14, or in any other suitable manner.

Figure 15:
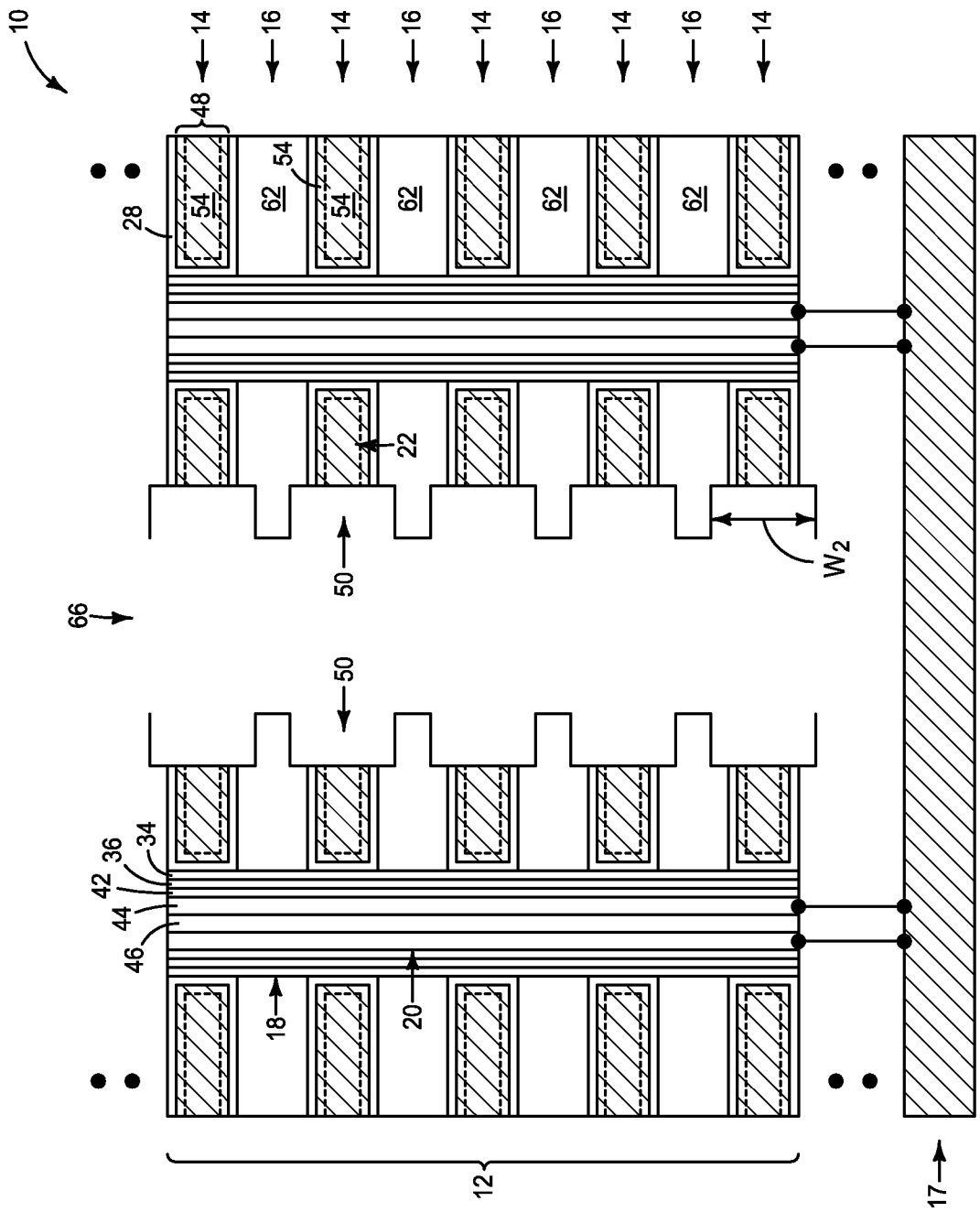
FIGS. 15 and 16 are diagrammatic cross-sectional side views of the region of the integrated assembly of FIG. 5 shown at example sequential process stages following that of FIG. 9.

Some embodiments may include processing to form the second conductive structures 72 to be substantially thicker (vertically wider) than the first conductive structures 22. For instance, FIG. 15 shows a process stage which may follow that of FIG. 9. First regions of the cavities 50 may be considered to be formed at the process stage of FIG. 9. Portions of the second material 62 are exposed along such first regions at the process stage of FIG. 9. The first regions have an initial vertical width $W_1$ at the process stage of FIG. 9. The exposed portions of the second material 62 are vertically recessed to extend the vertical width to a width W2 at the process stage of FIG. 15, which vertically widens the cavities 50.

Figure 16:
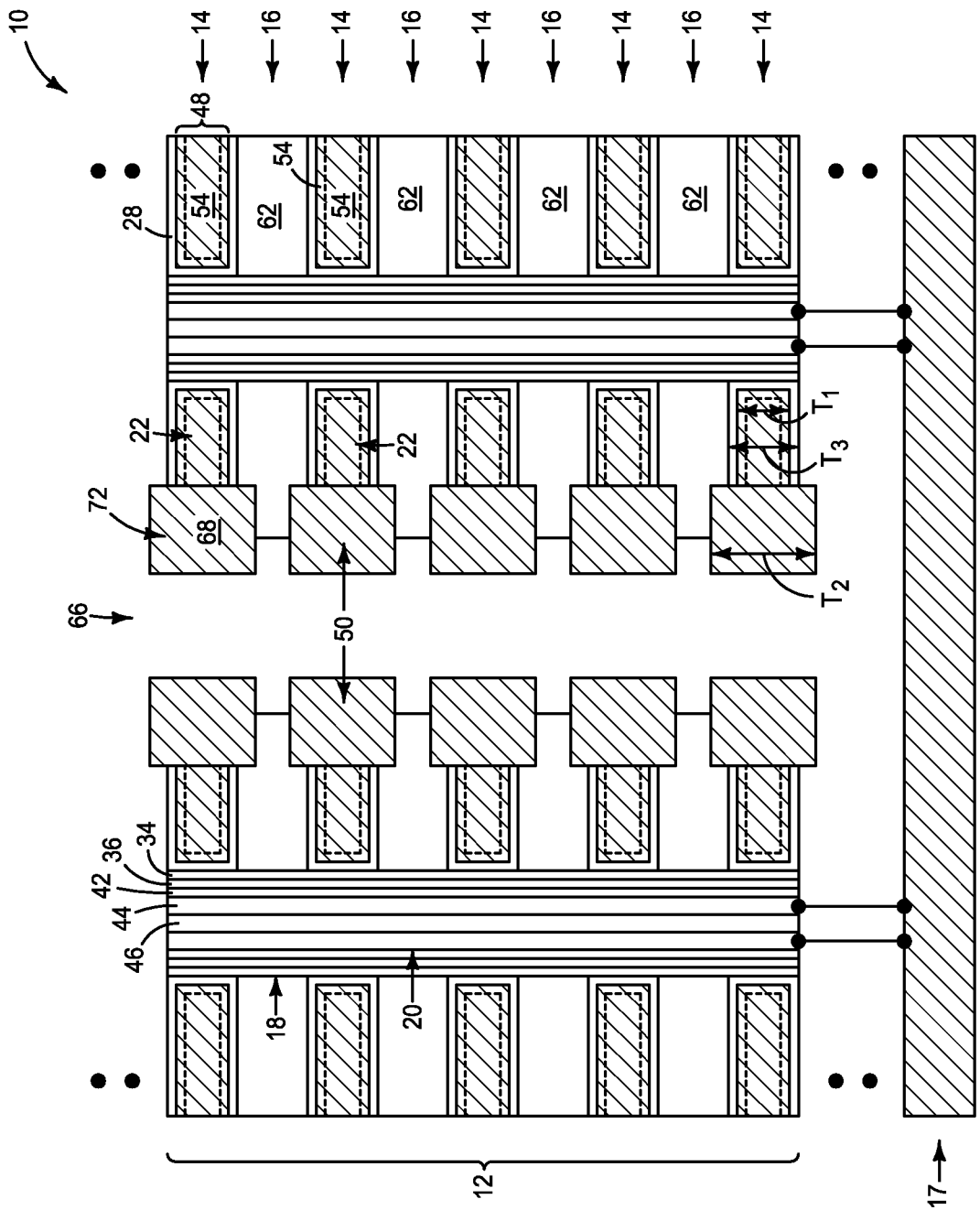

FIG. 16 shows a process stage analogous to that of FIG. 10, but following the process stage of FIG. 15. Accordingly, the second conductive structures 72 are formed, with such second conductive structures comprising the material 68. The second conductive structures 72 have the second vertical thickness $T_2$, and the conductive structures 22 have the first vertical thickness $T_1$. In the configuration of FIG. 16, the second vertical thickness $T_2$ is much larger than the first vertical thickness $T_1$. In some embodiments, the vertical thicknesses of the second conductive structures 72 may be at least about 10% larger than the vertical thicknesses of the first conductive structures 22, at least about 20% larger than the vertical thicknesses of the first conductive structures 22, etc.

Figure 16A:
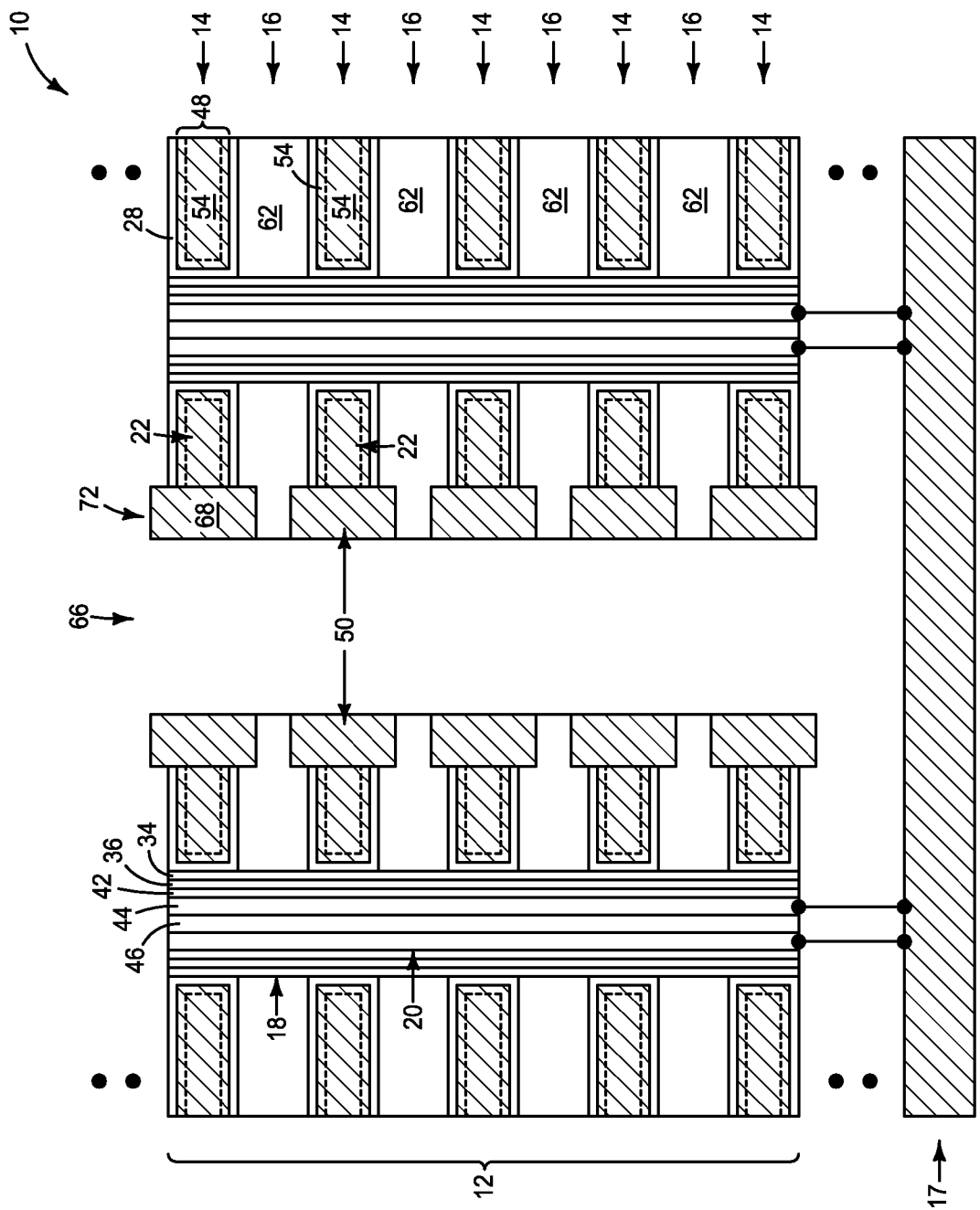
FIG. 16A is a diagrammatic cross-sectional side view of the region of the integrated assembly of FIG. 5 shown at an example sequential process stage alternative to that of FIG. 16.

FIG. 16A shows a configuration analogous to that of FIG. 16, but in which the conductive structures 72 are entirely contained within the cavities 50.

Figure 17:
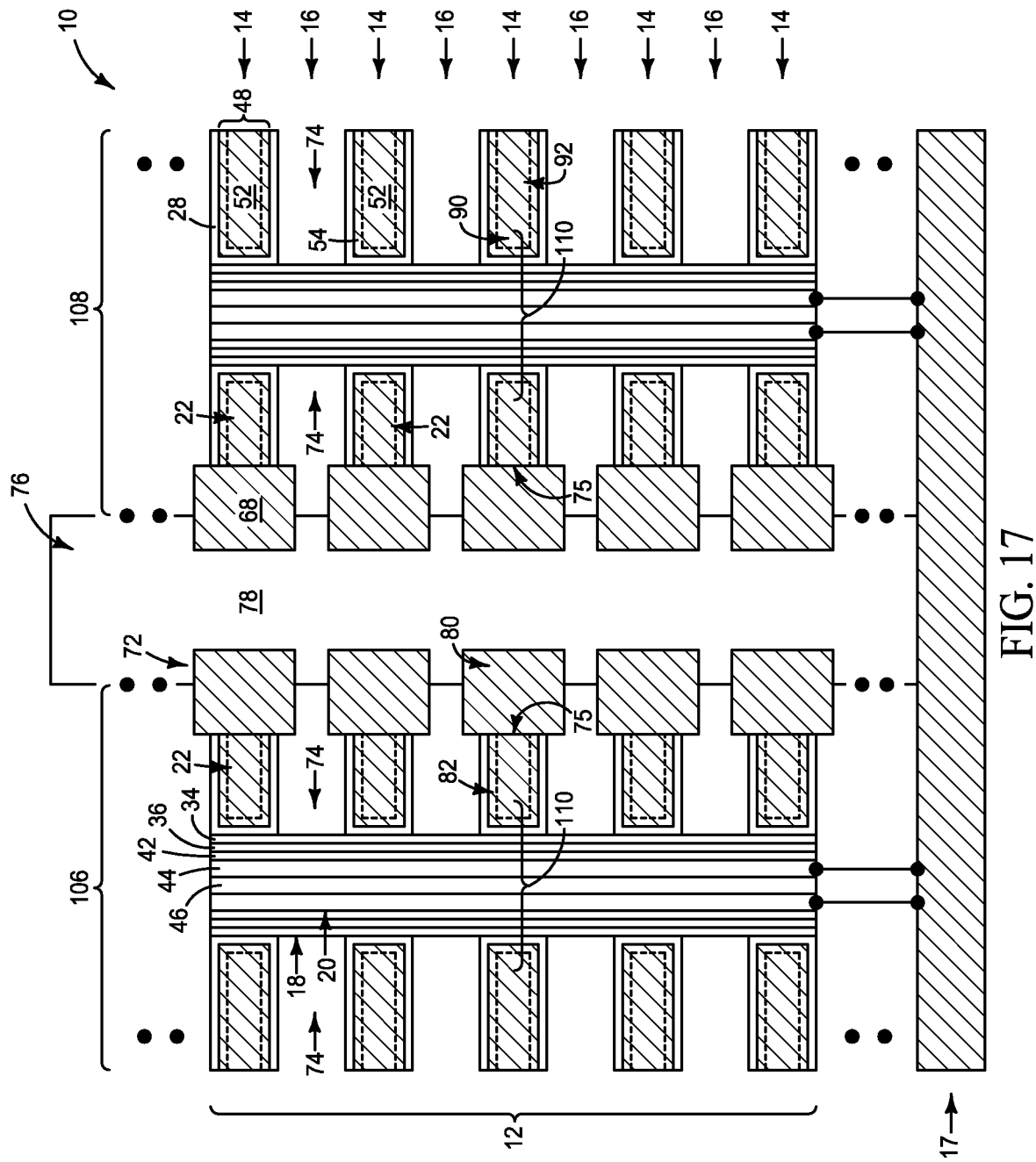
FIG. 17 is a diagrammatic cross-sectional side view of the region of the integrated assembly of FIG. 5 shown at an example process stage subsequent to that of FIG. 16.

FIG. 17 shows the configuration of FIG. 16 at a processing stage analogous to that of FIGS. 12 and 12A. The configuration of FIG. 17 includes the panel 76 formed within the slit 66. The panel 76 may separate a first memory-block-region 106 from a second memory-block-region 108. Each of the memory-block regions comprises vertically-stacked memory cells 110 along the pillars 18.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a stack of alternating first and second levels. A panel extends through the stack. The first levels have proximal regions adjacent the panel, and have distal regions further from the panel than the proximal regions. The distal regions have first conductive structures, and the proximal regions have second conductive structures. Detectable interfaces are present where the first conductive structures join to the second conductive structures.

Some embodiments include an integrated assembly having a vertical stack of alternating void levels and non-void levels. Channel-material-pillars extend vertically through the stack. A panel extends vertically through the stack and separates a first memory-block-region from a second memory-block-region. The non-void levels have proximal regions adjacent the panel, and have distal regions further from the panel than the proximal regions. The distal regions comprise first conductive structures, with each of said first conductive structures having at least a portion comprising a first composition. The proximal regions comprise second conductive structures, with each of said second conductive structures having at least a portion with a second composition different from said first composition. The second composition of said second conductive structures is directly against the first composition of said first conductive structures.

Some embodiments include a method of forming an integrated assembly. A stack of alternating first levels and second levels is formed. The first levels comprise first material and the second levels comprise second material. Openings are formed to extend through the stack. Charge-storage material, tunneling material and channel material are formed within the openings. A slit is formed to extend through the stack. Etchant is flowed into the slit to remove the first material and to leave first voids between the second levels. First conductive structures are formed within the first voids. The first conductive structures having proximal ends adjacent the slit. The proximal ends are recessed to form cavities adjacent the slit along the first levels. Second conductive structures are formed within the cavities. The second conductive structures are between the slit and the recessed proximal ends of the first conductive structures. The second material is removed to leave second voids between the first conductive structures. A panel is formed within the slit.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a stack of alternating first and second levels;
   a panel extending through the stack, the panel comprising an insulative panel material;
   the first levels having proximal regions adjacent the panel, and having distal regions further from the panel than the proximal regions; the distal regions comprising first conductive structures and the proximal regions comprising second conductive structures having upper and lower surfaces in direct physical contact with the insulative panel material, the insulative panel material being absent from contacting the first conductive structure; and
   detectable interfaces where the first conductive structures join to the second conductive structures.

2. The integrated assembly of claim 1 wherein the first conductive structures comprise a first composition along the detectable interfaces, and wherein the second conductive structures comprise a second composition along the detectable interfaces, with the second composition being different from the first composition.

3. The integrated assembly of claim 1 wherein the panel separates a first memory-block-region from a second memory-block-region.

4. The integrated assembly of claim 1 comprising channel-material-pillars extending through the stack.

5. The integrated assembly of claim 1 wherein the second levels comprise void regions between the distal regions of the first levels.

6. The integrated assembly of claim 1 wherein the first and second conductive structures comprise a first thickness and a second thickness, respectively; and wherein the second thickness is at least as large as the first thickness.

7. The integrated assembly of claim 6 wherein the second thickness is larger than the first thickness.

8. The integrated assembly of claim 6 wherein the second thickness is at least about 10% larger than the first thickness.

9. The integrated assembly of claim 6 wherein the second thickness is at least about 20% larger than the first thickness.

10. The integrated assembly of claim 1 wherein the second conductive structures are substantially rectangular-shaped along a cross-section.

11. The integrated assembly of claim 1 wherein the second conductive structures comprise conductively-doped semiconductor material.

12. The integrated assembly of claim 1 wherein the second conductive structures comprise one or more of titanium, cobalt, nickel, tungsten and ruthenium.

13. The integrated assembly of claim 1 wherein the second conductive structures comprise one or more of metal nitride, metal silicide, metal carbide and metal boride.

14. The integrated assembly of claim 1 wherein each of the first conductive structures includes a tungsten-containing core and a metal-nitride-containing liner along an outer periphery of the tungsten-containing core.

15. The integrated assembly of claim 14 wherein the metal-nitride-containing liner comprises titanium nitride.

16. The integrated assembly of claim 15 wherein the second conductive structures comprise titanium nitride or tungsten.

17. The integrated assembly of claim 15 wherein the second conductive structures comprise one or more compositions other than titanium nitride and tungsten.

18. The integrated assembly of claim 14 wherein the distal region of each of the first levels includes dielectric material along an outer periphery of the metal-nitride-containing liner.

19. The integrated assembly of claim 18 wherein the dielectric material is a high-k material.

20. An integrated assembly, comprising:
    a vertical stack of alternating void levels and non-void levels;
    channel-material-pillars extending vertically through the stack;
    a panel extending vertically through the stack and separating a first memory-block-region from a second memory-block-region, the panel comprising an insulative material;
    the non-void levels having proximal regions adjacent the panel, and having distal regions further from the panel than the proximal regions; the distal regions comprising first conductive structures, with each of said first conductive structures having at least a portion comprising a first composition; the proximal regions comprising second conductive structures having upper and lower surfaces contacting the insulative material of the panel, with each of said second conductive structures having at least a portion with a second composition different from said first composition; the second composition of said second conductive structures being directly against the first composition of said first conductive structures; and
    a void extending between vertically adjacent of the first conductive structures.

21. The integrated assembly of claim 20 wherein the second conductive structures comprise vertical widths larger than first vertical widths of the first conductive structures.

22. The integrated assembly of claim 20 wherein the second conductive structures comprise conductively-doped semiconductor material.

23. The integrated assembly of claim 20 wherein the second conductive structures comprise one or more of titanium, cobalt, nickel, tungsten and ruthenium.

24. The integrated assembly of claim 23 wherein each of the first conductive structures includes a tungsten-containing core and a metal-nitride-containing liner along an outer periphery of the tungsten-containing core.

25. The integrated assembly of claim 24 wherein the metal-nitride-containing liner comprises titanium nitride.

26. The integrated assembly of claim 24 wherein the distal region of each of the non-void levels includes dielectric material along an outer periphery of the metal-nitride-containing liner.

27. The integrated assembly of claim 26 wherein the distal regions of the non-void levels have first vertical widths which encompass the conductive structures and the dielectric material, and wherein the second conductive structures have second vertical widths at least as about as large as the first vertical widths.

28. The integrated assembly of claim 27 wherein the second vertical widths are greater than the first vertical widths.

29. The integrated assembly of claim 26 wherein the dielectric material is a high-k material.

* * * * *